US009627485B2

(12) United States Patent
Zhou et al.

(10) Patent No.: US 9,627,485 B2
(45) Date of Patent: Apr. 18, 2017

(54) VAPOR-TRAPPING GROWTH OF SINGLE-CRYSTALLINE GRAPHENE FLOWERS

(71) Applicants: Chongwu Zhou, San Marino, CA (US); Yi Zhang, Beaverton, OR (US); Luyao Zhang, Los Angeles, CA (US)

(72) Inventors: Chongwu Zhou, San Marino, CA (US); Yi Zhang, Beaverton, OR (US); Luyao Zhang, Los Angeles, CA (US)

(73) Assignee: University of Southern California, Los Angeles, CA (US)

( * ) Notice: Subject to any disclaimer, the term of this patent is extended or adjusted under 35 U.S.C. 154(b) by 0 days.

(21) Appl. No.: 14/214,173

(22) Filed: Mar. 14, 2014

(65) Prior Publication Data

US 2014/0312421 A1 Oct. 23, 2014

Related U.S. Application Data

(60) Provisional application No. 61/800,037, filed on Mar. 15, 2013.

(51) Int. Cl.
*C01B 31/04* (2006.01)
*H01L 21/283* (2006.01)
(Continued)

(52) U.S. Cl.
CPC ...... *H01L 29/1606* (2013.01); *C01B 31/0453* (2013.01); *C23C 16/26* (2013.01);
(Continued)

(58) Field of Classification Search
CPC ............. H01L 21/7624; H01L 29/1606; H01L 21/283; H01L 21/285; H01L 21/28506;
(Continued)

(56) References Cited

U.S. PATENT DOCUMENTS

2013/0068521 A1* 3/2013 Hong et al. .................. 174/388
2013/0089666 A1* 4/2013 Boi .......................... C23C 16/26
427/249.1
(Continued)

FOREIGN PATENT DOCUMENTS

WO WO 2011108878 A2 * 9/2011

OTHER PUBLICATIONS

Vlassiouk et al., Role of Hydrogen in Chemical Vapor Deposition Growth of Large Single-Crystal Graphene, Jun. 27, 2011, American Chemical Society, ACSNANO, vol. 5, No. 7, pp. 6069-6076.*
(Continued)

*Primary Examiner* — Natalia Gondarenko
(74) *Attorney, Agent, or Firm* — Fish & Richardson P.C.

(57) ABSTRACT

A method for growing a graphene layer on a metal foil includes placing a vessel into a chemical vapor deposition chamber, the vessel having a metal foil positioned therein. The method includes evacuating the chemical vapor deposition chamber, introducing hydrogen gas into the chamber to achieve a first pressure less than atmospheric pressure, heating the atmosphere in the chamber to anneal the metal foil, introducing methane and hydrogen into the chamber to achieve a second pressure less than atmospheric pressure.

15 Claims, 25 Drawing Sheets

(51) Int. Cl.
*H01L 29/16* (2006.01)
*H01L 29/66* (2006.01)
*H01L 29/786* (2006.01)
*C30B 25/10* (2006.01)
*H01L 21/762* (2006.01)
*C30B 25/02* (2006.01)
*C30B 29/02* (2006.01)
*C23C 16/26* (2006.01)
*C23C 16/46* (2006.01)

(52) U.S. Cl.
CPC .............. *C30B 25/02* (2013.01); *C30B 25/10* (2013.01); *C30B 29/02* (2013.01); *H01L 21/7624* (2013.01); *H01L 29/66742* (2013.01); *H01L 29/78603* (2013.01); *H01L 29/78684* (2013.01); *C01B 2204/02* (2013.01); *C01B 2204/32* (2013.01)

(58) Field of Classification Search
CPC ......... H01L 21/28512; H01L 21/28556; H01L 21/441; H01L 21/443; H01L 21/762; H01L 29/02; H01L 29/16; H01L 29/66; H01L 29/66015; H01L 29/786; H01L 29/66742; H01L 29/78684; H01L 2924/13088; C01B 31/0461; C01B 31/00; C30B 25/10; C23C 16/455; C23C 16/46; B82Y 30/00; B82Y 40/00
USPC .............. 257/347; 438/448, 151; 117/94, 80; 118/500, 728; 423/448; 216/20; 977/842, 843, 734; 427/249.1
See application file for complete search history.

(56) References Cited

U.S. PATENT DOCUMENTS

| | | | | |
|---|---|---|---|---|
| 2013/0266738 | A1* | 10/2013 | Lin et al. ..................... | 427/528 |
| 2013/0323157 | A1* | 12/2013 | Li ......................... | C23C 16/26 423/445 R |
| 2014/0014030 | A1* | 1/2014 | Tour ..................... | C30B 25/186 117/97 |

OTHER PUBLICATIONS

Li et al., Large-Area Graphene Single Crystals Grown by Low-Pressure Chemical Vapor Deposition of Methane on Copper, Feb. 10, 2011, J. Am. Chem. Soc., 133, pp. 2816-2819.*
Fan et al., Controllable growth of shaped graphene domains by atmospheric pressure chemical vapour deposition, 2011, Nanoscale, 3, pp. 4946-4950.*
Yan et al., Formation of Bilayer Bernal Graphene: Layer-by-Layer Epitaxy via Chemical Vapor Deposition, Feb. 15, 2011, NanoLetters, Am. Chem. Soc., 11, pp. 1106-1110.*
Chen et al., "Synthesis and Characterization of Large-Area Graphene and Graphite Films on Commercial Cu—Ni Alloy Films," Nano Lett., 2011,11:3519-3525.
De Arco et al., "Synthesis, Transfer, and Devices of Single- and Few-Layer Graphene by Chemical Vapor Deposition," IEEE Trans. Nanotechnol, 2009, 8: 135-138.
Gannett et al.., "Boron Nitride Substrates for High Mobility Chemical Vapor Deposited Graphene," Appl. Phys. Lett. 2011, 98:242105-1-242105-3.
Geim and Novoselov, "The Rise of Graphene," Nat. Mater., 2007, 6:183-191.
Huang et al., "Grains and Grain Boundaries in Single-Layer Graphene Atomic Patchwork Quilts," Nature, 2011, 469:389-393.
Jacobberger and Arnold, "Graphene Growth Dynamics on Epitaxial Copper Thin Films," Chem. Mater., 2013, 25:871-877.
Kim et al., "Chemical Vapor Deposition-Assembled Graphene Field-Effect Transistor on Hexagonal Boron Nitride," Appl. Phys. Lett., 2011, 98:262103-1-262103-3.
Kim et al., "Large-scale Pattern Growth of Graphene Films for Stretchable Transparent Electrodes," Nature, 2009, 457:706-710.
Li et al., "Large-Area Synthesis of High-Quality and Uniform Graphene Films on Copper Foils," Science, 2009, 324:1312-1314.
Li et al., "Graphene Films with Large Domain Size by a Two-Step Chemical Vapor Deposition Process," Nano Lett., 2010, 10:4328-4334.
Novoselov et al. "Two-Dimensional Gas of Massless Dirac Fermions in Graphene," Nature, 2005, 438:197-200.
Novoselov et al., "Electric Field Effect in Atomically Thin Carbon Films," Science, 2004, 306:666-669.
Rasool et al., "Atomic-Scale Characterization of Graphene Grown on Copper (100) Single Crystals," J. Am. Chem. Soc, 2011, 133:12536-12543.
Reina et al., "Large Area, Few-Layer Graphene Films on Arbitrary Substrates by Chemical Vapor Deposition," Nano Lett., 2009, 9:30-35.
Grantab et al., "Anomalous Strength Characteristics of Tilt Grain Boundaries in Graphene," Science, 2010, 330:946-948.
Wofford et al., "Graphene Islands on Cu Foils: The Interplay between Shape, Orientation, and Defects," Nano Lett., 2010, 10:4890-4896.
Wood et al., "Effects of Polycrystalline Cu Substrate on Graphene Growth by Chemical Vapor Deposition," Nano Lett., 2011, 11:4547-4554.
Yazyev and Louie, "Electronic Transport in Polycrystalline Graphene," Nat. Mater., 2010, 9: 806-809.
Yu et al., "Control and Characterization of Individual Grains and Grain Boundaries in Graphene Grown by Chemical Vapour Deposition," Nat. Mater., 2011, 10:443-449.
Yu et al., "Graphene Segregated on Ni Surfaces and Transferred to Insulators," Appl. Phys. Lett., 2008, 93:113103-1-113103-3.
Zhang et al. "Anisotropic Hydrogen Etching of Chemical Vapor Deposited Graphene," ACS Nano 2011, 6:126-132.
Zhang et al., "Experimental Observation of the Quantum Hall Effect and Berry's Phase in Graphene," Nature, 2005, 438:201-204.
Wang et al., "Growth and Performance of Yttrium Oxide as an Ideal High-k Gate Dielectric for Carbon-Based Electronics," Nano Lett., 2010, 10:12024-2030.

* cited by examiner

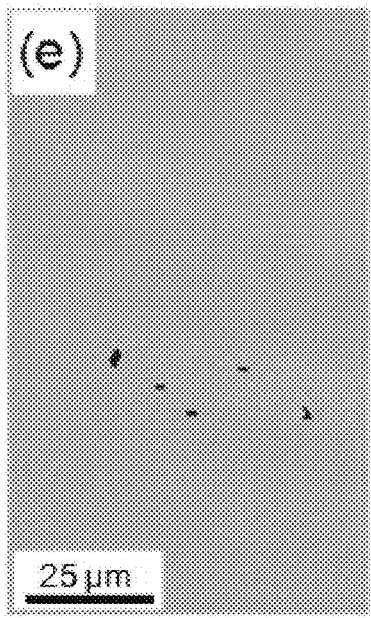
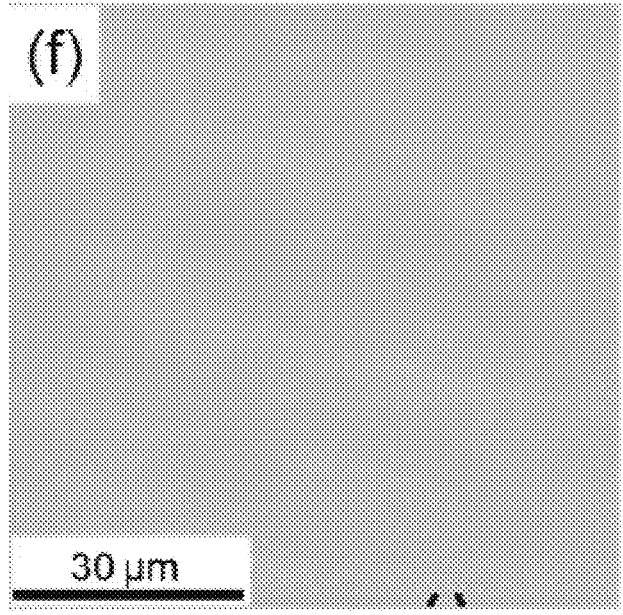
Fig. 7e
Fig. 7f
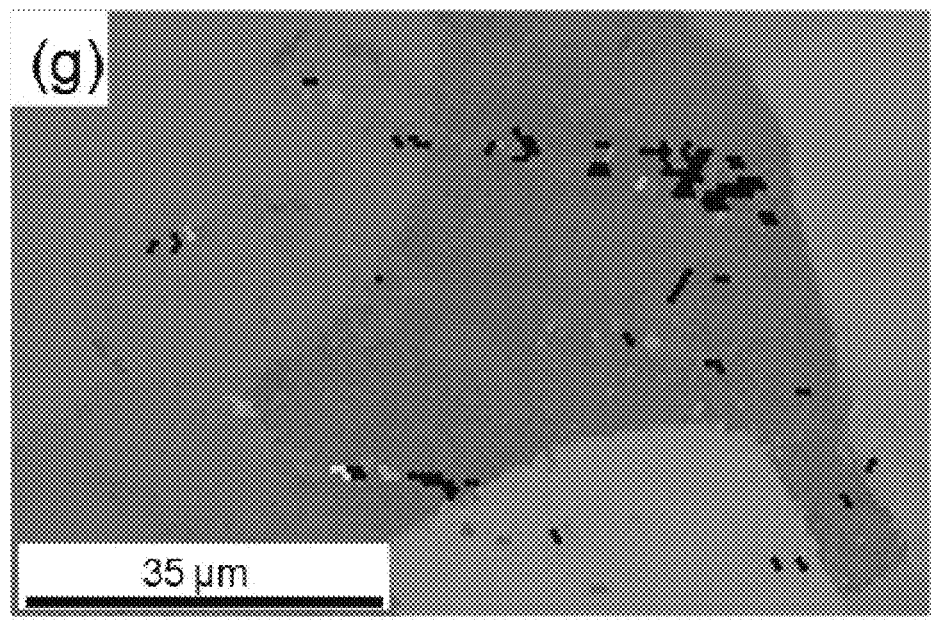
Fig. 7g

VAPOR-TRAPPING GROWTH OF SINGLE-CRYSTALLINE GRAPHENE FLOWERS

CROSS-REFERENCE TO RELATED APPLICATION

This application claims priority to U.S. Application Ser. No. 61/800,037, filed on Mar. 15, 2013, which is incorporated herein by reference.

FEDERALLY SPONSORED RESEARCH OR DEVELOPMENT

The invention was made with government support under N000141210806 A00002 and N000141110880 P00005 awarded by the Office of Naval Research. The government has certain rights in the invention.

TECHNICAL FIELD

This disclosure relates to vapor-trapping growth of graphene flowers.

BACKGROUND

Graphene is a two-dimensional, honeycomb lattice arrangement with unique physical properties. To overcome the disadvantage of small-scale production of graphene using mechanical exfoliation of highly orientated polymeric graphite (HOPG), chemical vapor deposition (CVD) of large-area single-layer graphene on metal films has been explored from various aspects. Despite significant progress, CVD graphene is usually a polycrystalline film made of small grains. The grain boundaries have been found to impede both transport and mechanical properties, and growth of large-grain, single-crystalline graphene for various applications has been explored. One method involves using a copper enclosure to grow large graphene single crystals. This process, however, depends on how the copper enclosure is manually made, and the copper enclosure does not allow probing the gas environment inside.

SUMMARY

A vapor-trapping method for the growth of large-grain, single-crystalline graphene flowers with grain size up to 100 µm is described. Controlled growth of graphene flowers with four lobes and six lobes has been achieved by varying the growth pressure and the methane to hydrogen ratio. The graphene morphology had little correlation with the crystalline orientation of underlying copper substrate. Field effect transistors were fabricated based on graphene flowers and the fitted device mobility as high as ~4,200 cm$^2$ V$^{-1}$ s$^{-1}$ on Si/SiO$_2$ and ~20,000 cm$^2$ V$^{-1}$ s$^{-1}$ on hexagonal boron nitride (h-BN) was obtained. The vapor-trapping method described herein provides a viable way for large-grain single-crystalline graphene synthesis for potential high-performance graphene-based electronics.

In one aspect, methods described herein include placing a vessel defining an opening into a chemical vapor deposition chamber where metal foil is positioned in the vessel, evacuating the chemical vapor deposition chamber, introducing hydrogen gas into the chamber to achieve a first pressure less than atmospheric pressure, heating the atmosphere in the chamber to anneal the metal foil, introducing methane and hydrogen into the chamber to achieve a second pressure less than atmospheric pressure, and depositing carbon on the metal foil to yield a graphene layer on the metal foil.

Implementations can include one or more of the following features. The vessel defines a single opening, and the methane and hydrogen introduced into the chamber do not flow through the vessel. The methane and hydrogen introduced into the chamber diffuse into the vessel. A local environment between the metal foil and an interior of the vessel is different from an environment inside the chamber, and wherein the metal foil is a copper foil. The vessel reduces a supply of carbon to the metal foil and creates a quasi-static reactant gas distribution. The graphene layer is in the shape of a four-lobed flower, a six-lobed flower, or a combination thereof. A dimension of the graphene layer on the metal foil is up to 100 µm. Lobes of the four-lobed flower, the six-lobed flower, or the combination thereof are a single-layer graphene. A center of the four-lobed flower, the six-lobed flower, or the combination thereof is a bilayer graphene. The method further includes adjusting a total pressure, a methane to hydrogen flow rate ratio, or both to obtain a desired morphology. A ratio of a flow rate of the methane to a flow rate of the hydrogen is between 1:10 to 1:20. A total pressure of methane and hydrogen is less than 200 mTorr. The method includes removing the graphene layer from the metal foil. The graphene produces one set of symmetric six-fold electron diffraction pattern oriented in the same direction. A single-crystalline graphene layer formed by the method described herein. A field effect transistor includes a graphene layer formed by the method described herein. Forming a field effect transistor includes providing a silicon substrate, providing a thermal oxide on the silicon substrate, transferring the graphene layer formed by the method described herein from the metal foil onto the thermal oxide layer to form a graphene channel, depositing a source electrode at one end of the graphene channel; and depositing a drain electrode at another end of the graphene channel. A fitted device mobility of a transistor formed using the methods described herein is about 4,200 cm$^2$ V$^{-1}$ s$^{-1}$. The field effect transistor formed using the methods described herein is back-gated. The source electrode is deposited in a bilayer region of the graphene channel. The method includes transferring the graphene layer onto hexagonal boron nitride (h-BN), to form a device having an electron mobility of about 20,000 cm$^2$ V$^{-1}$ s$^{-1}$. The device is a Hall-bar device.

BRIEF DESCRIPTION OF THE DRAWINGS

The patent or application file contains at least one drawing executed in color. Copies of this patent or patent application publication with color drawings(s) will be provided by the Office upon request and payment of the necessary fee.

FIG. 4b shows a zoomed-in SEM image of the graphene flower marked using a dashed square in FIG. 3a.

FIG. 7e shows a corresponding electron backscatter diffraction (EBSD) orientation map image of the location highlighted by the dashed square in FIG. 7a. FIG. 7f shows a corresponding EBSD orientation map image of the location highlighted by the dashed square in FIG. 7b. FIG. 7g shows a corresponding EBSD orientation map image of the location highlighted by the dashed square in FIG. 7c.

DETAILED DESCRIPTION

Vapor-trapping apparatus and methods to grow large-grain, single-crystalline graphene with controlled grain morphology are described herein.

Figure 1A:
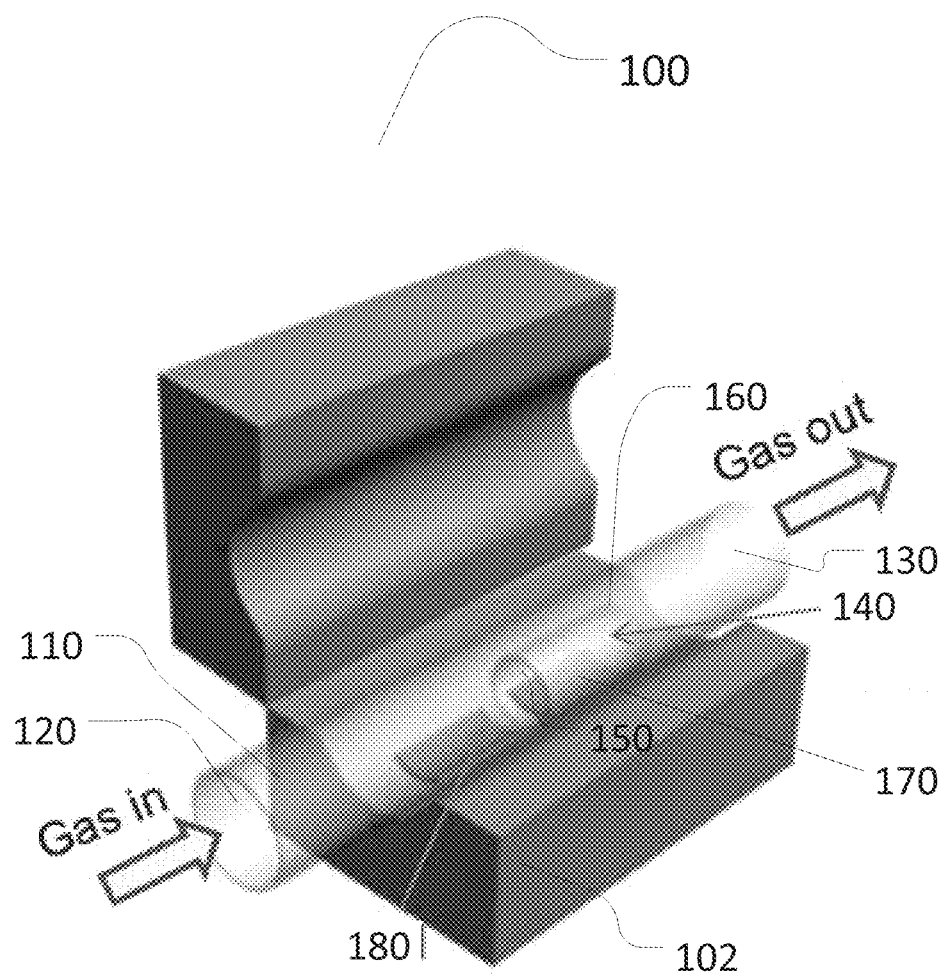
FIG. 1a shows a schematic diagram of a vapor-trapping CVD apparatus for graphene growth.
Figure 1:
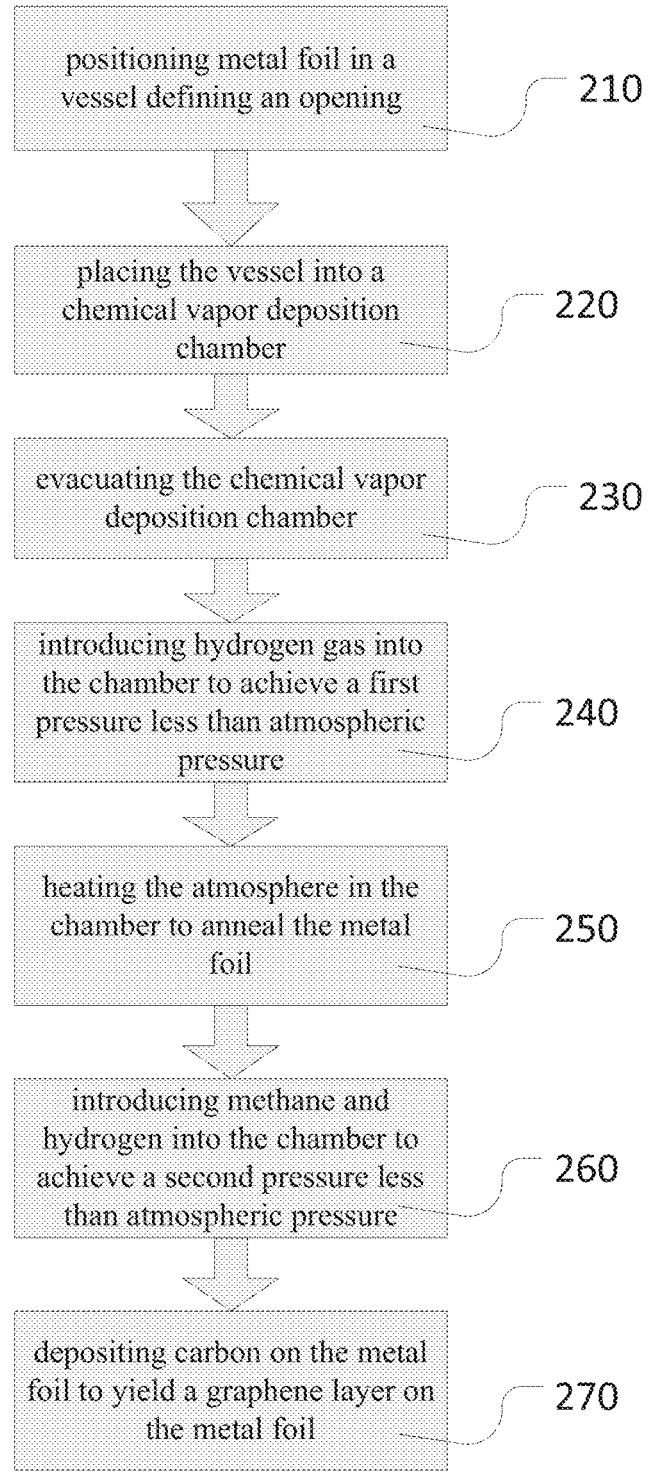
FIG. 1b shows a flow chart of a vapor-trapping method for grapheme growth.
FIG. 1c shows a low magnification scanning electron microscope (SEM) image of a six-lobe graphene flower grown on Cu foil placed inside a vapor-trapping tube.
FIG. 1d shows a high magnification SEM image of a six-lobe graphene flower grown on Cu foil placed inside a vapor-trapping tube.
FIG. 1e shows a SEM image of a four-lobe graphene flower grown on Cu foil placed inside the vapor-trapping tube.
FIG. 1f shows graphene grown on Cu foil outside the vapor-trapping tube.

FIG. 1a depicts an example of a vapor-trapping chemical vapor deposition (CVD) apparatus 100 that is used to synthesize graphene. A two-inch long quartz tube 110 having two open ends 120 and 130 is supported on a support 102. The two-inch long quartz tube 110 serves as the CVD chamber. A half-inch long quartz tube 140 having only one open end 150 is placed within the two-inch long quartz tube 110. The half-inch long quartz tube 140 has a closed end 160. The quartz tube 110 can have a diameter of 2 inch while the quartz tube 140 can have a diameter of 1 inch. The support 102 contains heater elements. A piece of Cu foil 170 is placed in the quartz tube 140. Another piece of Cu foil 180 is placed in the quartz tube 110 but outside of quartz tube 140 for comparison. Both Cu foils 170 and 180 are directly placed in the quartz tube(s) without having to be folded prior to the placement.

Gas is flown from the open end 120 of quartz tube 110 to the other open end 130 of the quartz tube 110. Some of the gas that is flown from open end 120 enters quartz tube 140 via the open end 150, and is trapped within the quartz tube 140, at least for a period of time. The period of time is between one minute and 24 hours, for example, 30 minutes. Thus, the local environment within the quartz tube 140 has a gas composition and gas flow rate that is different from that outside the quartz tube 140. Such differences produce interesting growth results of graphene.

In some embodiments, 7 sccm H$_2$ was introduced to the CVD chamber at 40 mTorr, and the temperature was brought up to 1000° C. in 40 minutes. The Cu foils 170 and 180 were annealed at 1000° C. for 20 minutes. 1 sccm CH$_4$ and 12.5 sccm H$_2$ were then introduced into the CVD chamber for graphene growth. The pressure was kept at 200 mTorr for 30 minutes during the growth. The CVD chamber was cooled down to room temperature while the flow of 1 sccm CH$_4$ and 12.5 sccm H$_2$ was continued. The CVD chamber was held at 200 mTorr while the CVD chamber was cooled down.

FIG. 1b is a flow chart of steps for synthesizing graphene flowers. In step 210, a metal foil, for example, copper foil, is positioned in a vessel, for example, having only a single open end 150. The copper foil may be rolled up prior to being positioned in the tube 140. In step 220, the tube 140 is placed into the tube 110, both of which are in the CVD chamber. In step 230, the CVD chamber is evacuated. In step 240, hydrogen gas is introduced into the CVD chamber. For example, 7 sccm of H$_2$ was introduced to the CVD chamber at 40 mTorr. In step 250, the metal foil is annealed, for example at 1000° C., with a continuing flow of H$_2$. In step 260, methane gas and hydrogen gas are introduced into the CVD chamber. For example, 1 sccm CH$_4$ and 12.5 sccm H$_2$ to maintain a pressure of 200 mTorr for 30 minutes. In step 270, carbon is deposited on the copper foil to form graphene flowers.

Figure 1C:
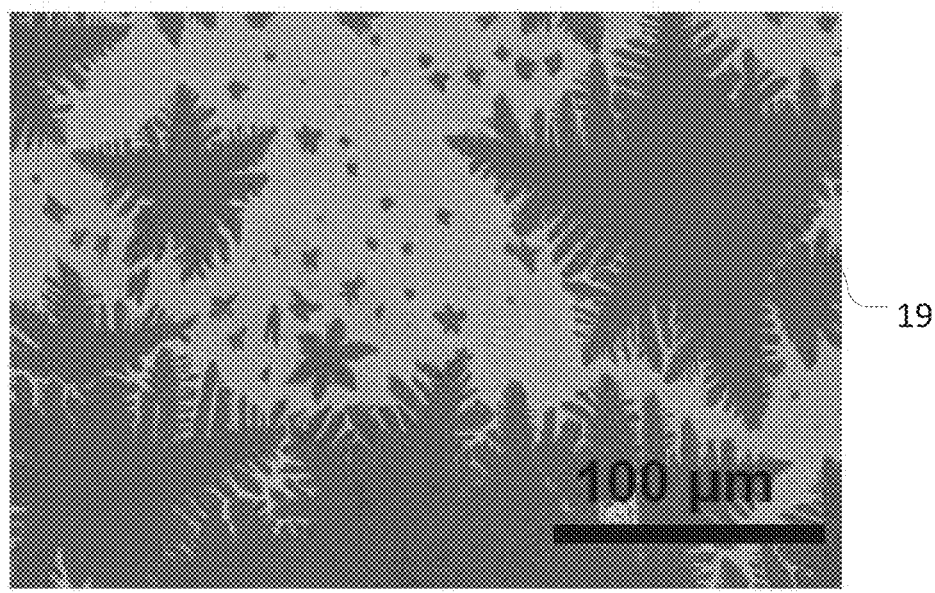
Figure 1D:
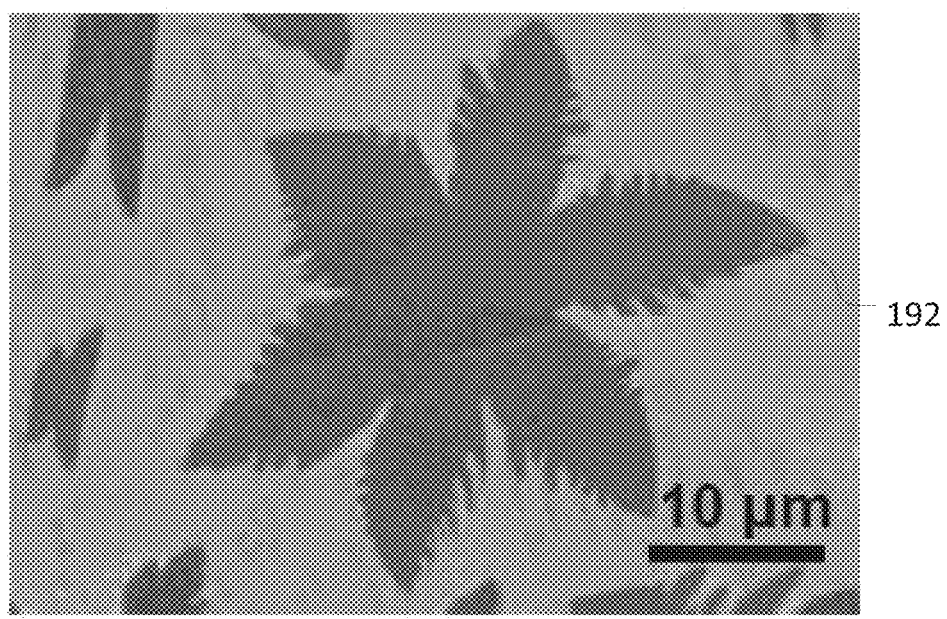
Figure 1E:
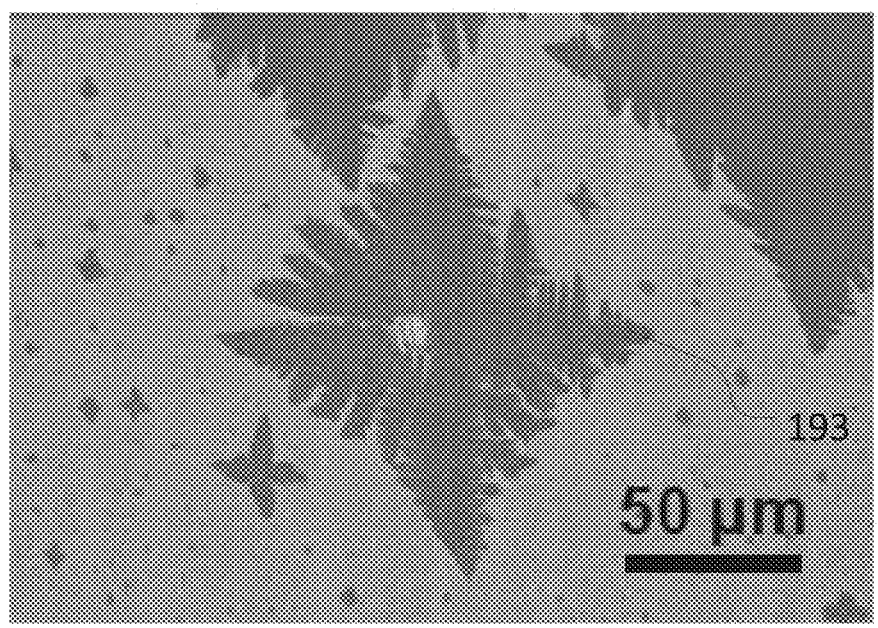
Figure 1F:
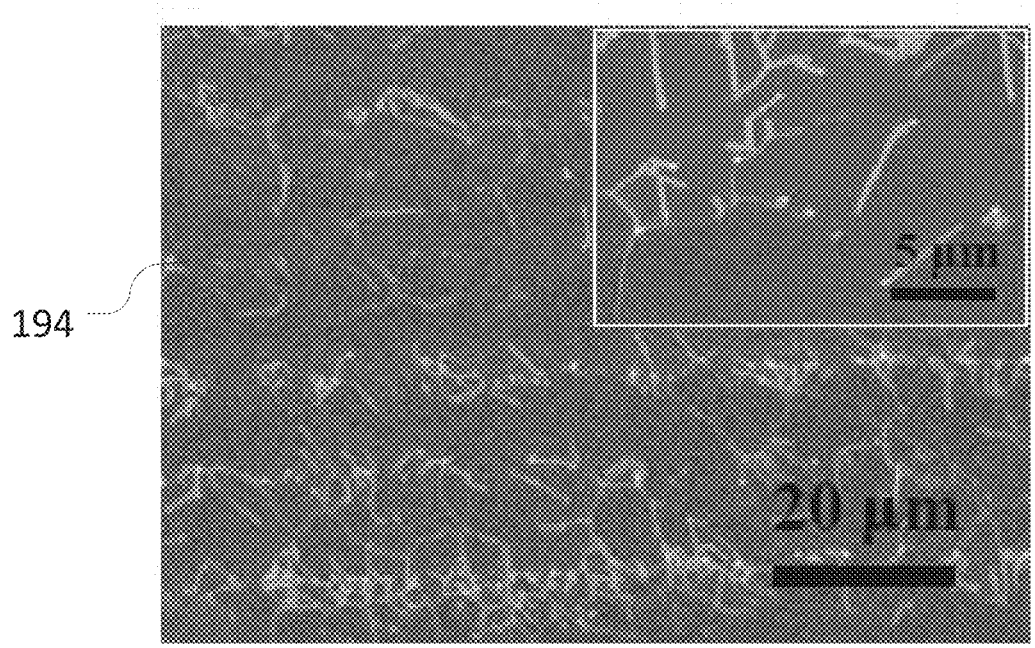

FIGS. 1c and 1d show SEM images of six-lobe graphene flowers 191, 192, grown on the bottom side of the Cu foil 170 placed inside the quartz tube 140. Graphene flowers are grown on both the top and bottom sides of the Cu foil 170, but only those grown on the bottom side are characterized using SEM. Six-lobe graphene flowers having sizes of up to 100 μm are shown in FIG. 1c. Four-lobe graphene flowers 193 grown on the Cu foil 170, as shown in FIG. 1e, can be obtained by varying growth parameters. Interestingly, a continuous graphene film 194 with slight etching, as shown in FIG. 1f, was found on the Cu foil 180 placed outside the quartz tube 140, but not flower-shaped graphene grains. The pronounced difference between graphene grown on the Cu foil 170 and Cu foil 180 indicates that the quartz tube 140 changes the local environment inside the tube. The presence of the quartz tube 140 reduces the carbon supply and creates a quasi-static reactant gas distribution which results in large flower-shaped graphene grains. The reactant gas distribution in the quartz tube 140 is the ratio of $CH_4$ to $H_2$ in the atmosphere of the quartz tube, and is smaller than the ratio of $CH_4$ to $H_2$ that is flown through the CVD chamber. The carbon supply is reduced for the Cu foil 170 because unlike the Cu foil 180, which receives a steady flow of $CH_4$ gas as it enters open end 120 of quartz tube 110 and exits through the open end 130, the close end of the quartz tube 140 does not allow Cu foil 170 to receive a replenished flow of $CH_4$ as readily as that received by Cu foil 180.

Figure 2A:
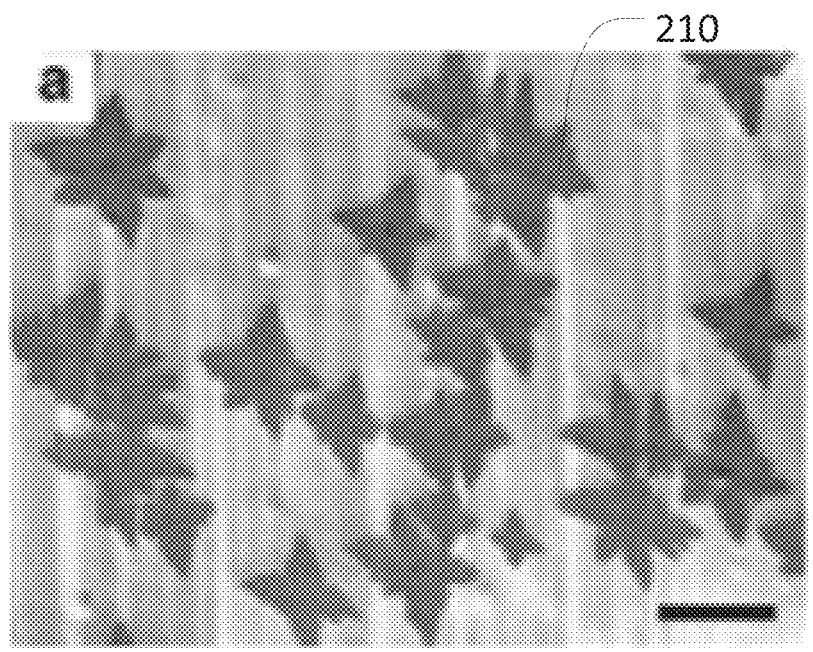
FIG. 2a shows a SEM image of graphene flowers grown without using vapor-trapping tube at low magnification.
Figure 2B:
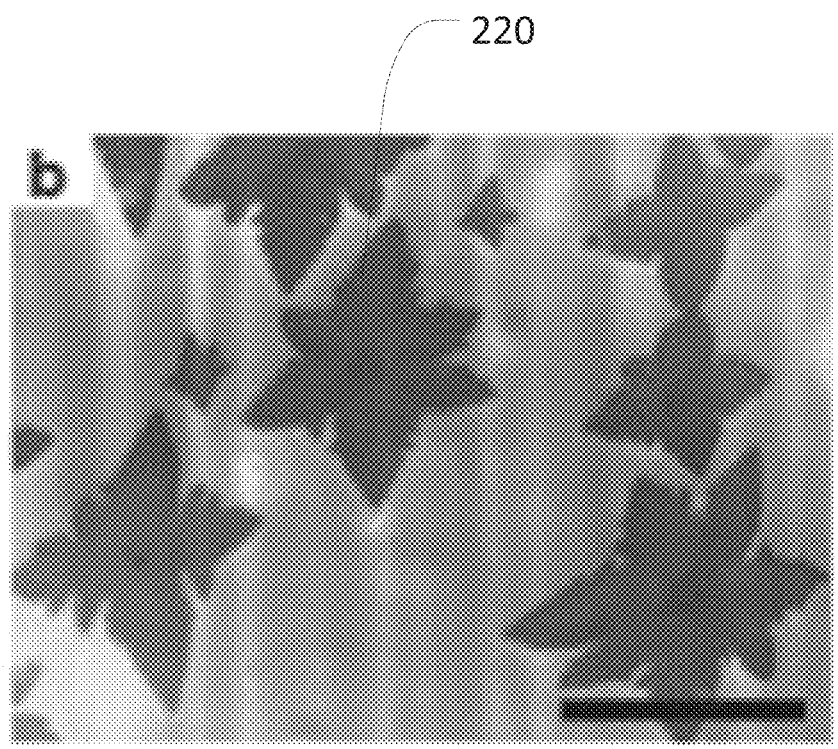
FIG. 2b shows a SEM image of graphene flowers grown without using vapor-trapping tube at high magnification. (scale bar: 50 μm).

FIGS. 2a and 2b are SEM images, at different magnifications, of as-grown graphene flowers 210 and 220 grown on Cu foil 180 without the quartz tube 140 by using a reduced methane flow rate of 0.5 sccm $CH_4$ and 25 sccm $H_2$ at a total pressure of 150 mTorr. Other growth parameters are the same as the recipe using vapor-trapping quartz tube 140. However, the shape of flowers was not as uniform as the ones obtained using quartz tube 140. The vapor-trapping approach described herein has little variation from run to run. Additionally, the open end 150 of the quartz tube 140 may permit probing of gas species inside the tube using techniques such as mass spectrometry.

Figure 3A:
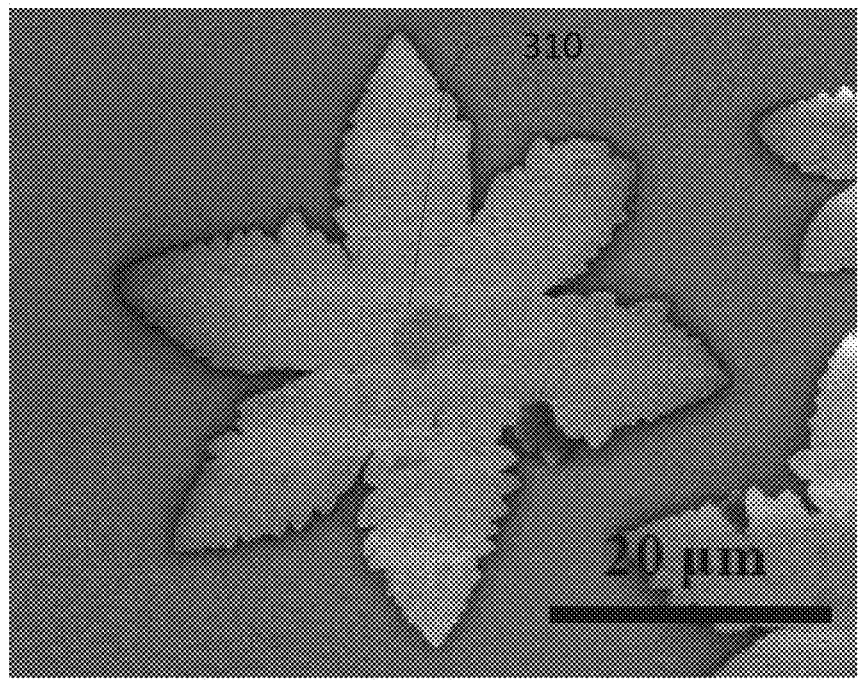
FIG. 3a shows a SEM of a six-lobe graphene flower that has been transferred on a Si/SiO$_2$ substrate.
Figure 3B:
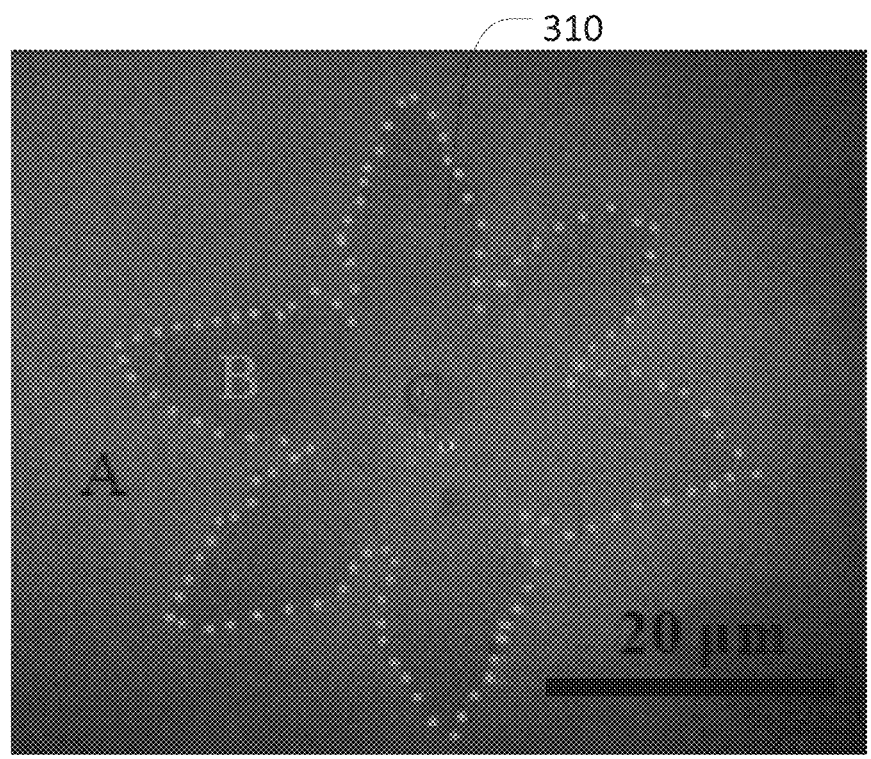
FIG. 3b shows an optical microscope image of a six-lobe graphene flower that has been transferred on a Si/SiO$_2$ substrate.

The graphene flowers grown on the Cu foil 180 were successfully transferred onto $Si/SiO_2$ substrates for further investigation using a transfer technique known in the art. Scanning electron microscopy (SEM) image and optical microscope image of a six-lobe graphene flower 310 are shown in FIGS. 3a and 3b. The grayscale contrast of the graphene flower is very uniform in both SEM and the optical image, except for the hexagonally-shaped central part that is darker than the lobes.

Figure 3C:
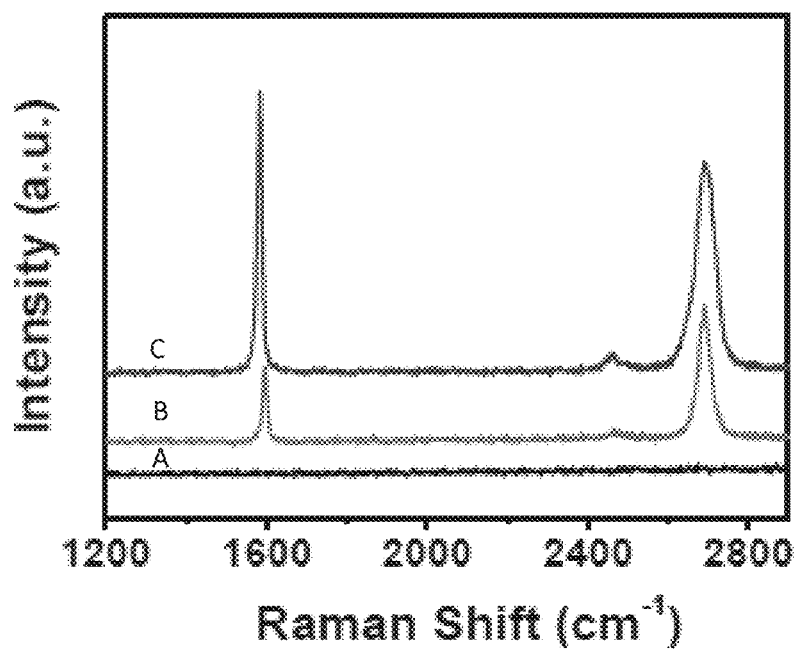
FIG. 3c shows Raman spectra taken from locations A, B, and C marked in FIG. 3b.
Figure 3D:
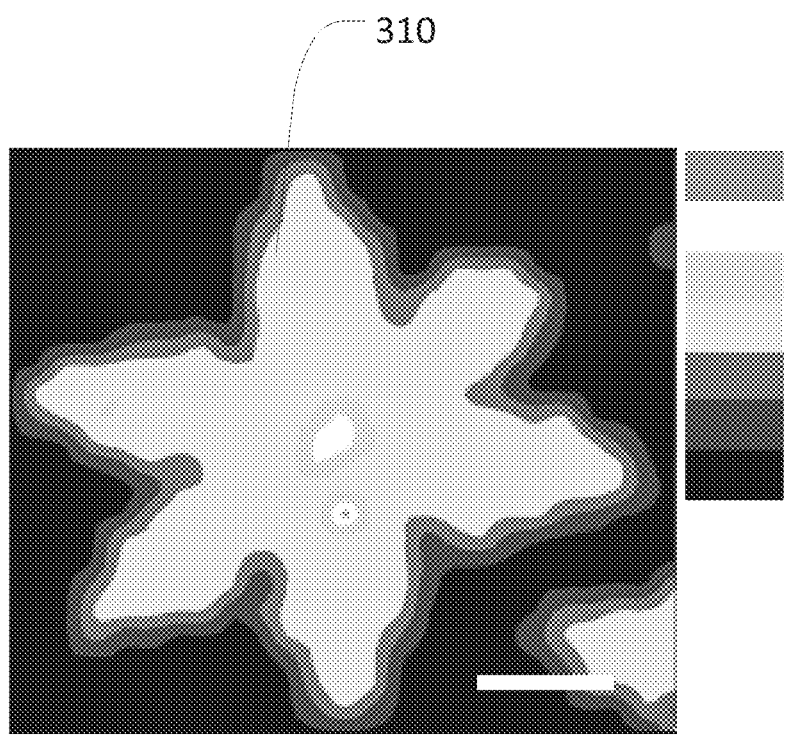
FIG. 3d shows a Raman map of G peak.
Figure 3E:
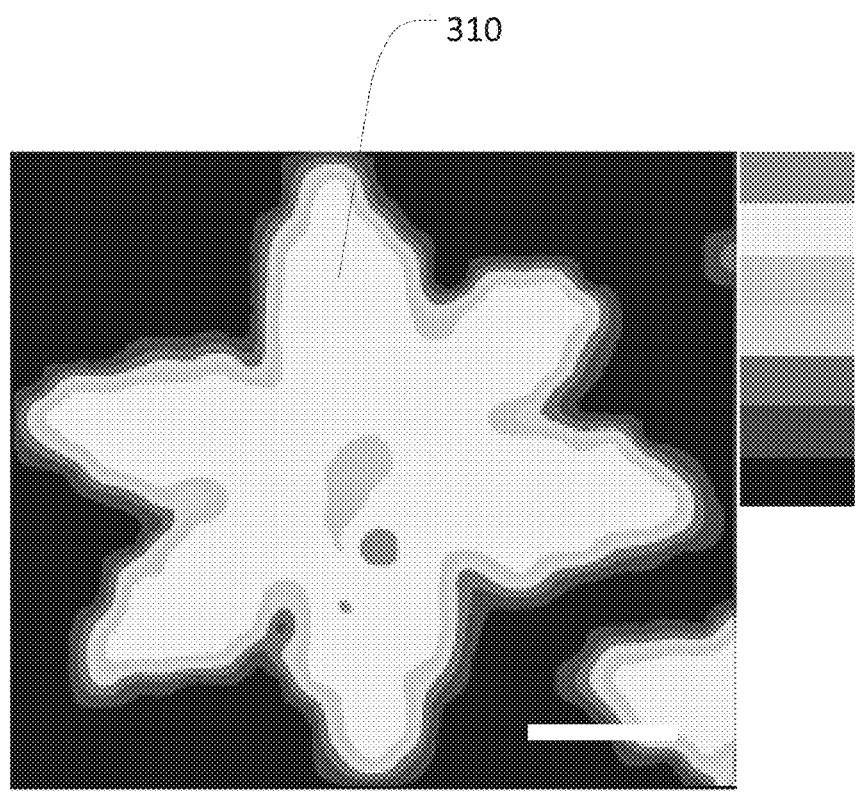
FIG. 3e shows a Raman map of 2D peak.
Figure 3F:
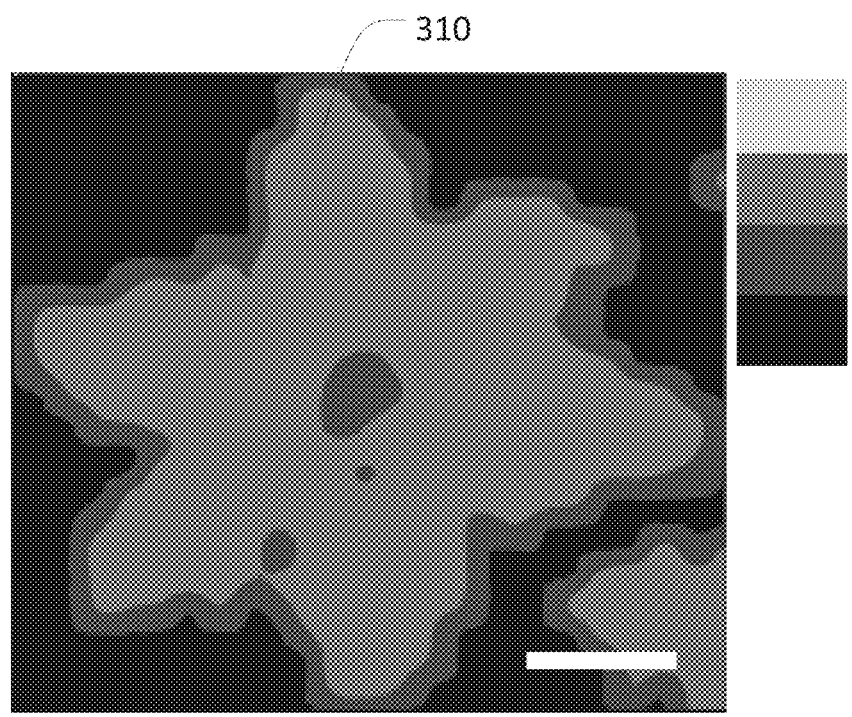
FIG. 3f shows a Raman map of 2D peak/G peak intensity ratio.

Raman spectra were taken from different locations on the transferred graphene sample. The Raman spectrum marked A in FIG. 3c was taken from the area outside the graphene flower (marked by letter A in FIG. 3b), which did not show any G or 2D peak of graphene as expected. G peak is due to carbon-carbon bond stretching of the sp2 hybridized carbon atoms in graphene and is located at 1580 $cm^{-1}$. 2D peak is a second order peak of the D peak. D peak is not observed in a first order Raman spectra of defect-free graphite because zone-boundary phonons do not satisfy the Raman selection rule. The 2D peak is located at 2700 $cm^{-1}$. The Raman spectrum marked B in FIG. 3c was taken from the area of graphene lobes (marked by letter B in FIG. 3b). It presents typical features of single-layer graphene: the intensity ratio of the G peak to 2D peak is ~0.5, and the full width at half-maximum (FWHM) of 2D band is ~33 $cm^{-1}$. The Raman spectrum marked C in FIG. 3c was collected from the center of the graphene flower (marked by letter C in FIG. 3b). The intensity ratio of the G peak to 2D peak is ~1 and the FWHM of 2D band ~53 $cm^{-1}$, which represents bilayer graphene. To further investigate large surface area of the graphene flower, Raman maps of G peak, 2D peak, and intensity ratio of the 2D peak to the G peak were collected and shown in FIG. 3d, 3e, 3f, respectively. Scale bar for FIGS. 3d-3f is 10 μm. The grayscale scale bar from bottom to top is 300, 500, 900, 1300, 1700, 2000 in FIG. 3d; 100, 600, 1200, 1800, 2400, 3200 in FIG. 3e; and 1, 2, 3, in FIG. 3f. The maps show very uniform G and 2D band for the graphene flower. Visual inspection shows only a little PMMA residue on the lower lobe. Therefore, Raman spectroscopy shows that the graphene flower is mainly single-layer graphene, with a small bilayer region in the center, which is believed to be the nucleation site. In general, a nucleation site can contain either monolayer or bilayer graphene. In the initial phases of graphene growth, both the top and the bottom graphene bilayer have access to a surface of the metal catalyst (for example, the copper surface) and the flow of hydrocarbon. As growth continues, the bottom layer (the second layer of the bilayer) is blocked by the top layer from access to the hydrocarbon, and further growth of the bottom layer is terminated.

The grain size of graphene is of great importance in device application since grain boundaries may affect the transport properties of graphene FETs, and decrease the device mobility. Low energy electron microscopy (LEEM) has been used to investigate graphene grain size, but access to LEEM is usually not widely available.

Figure 4A:
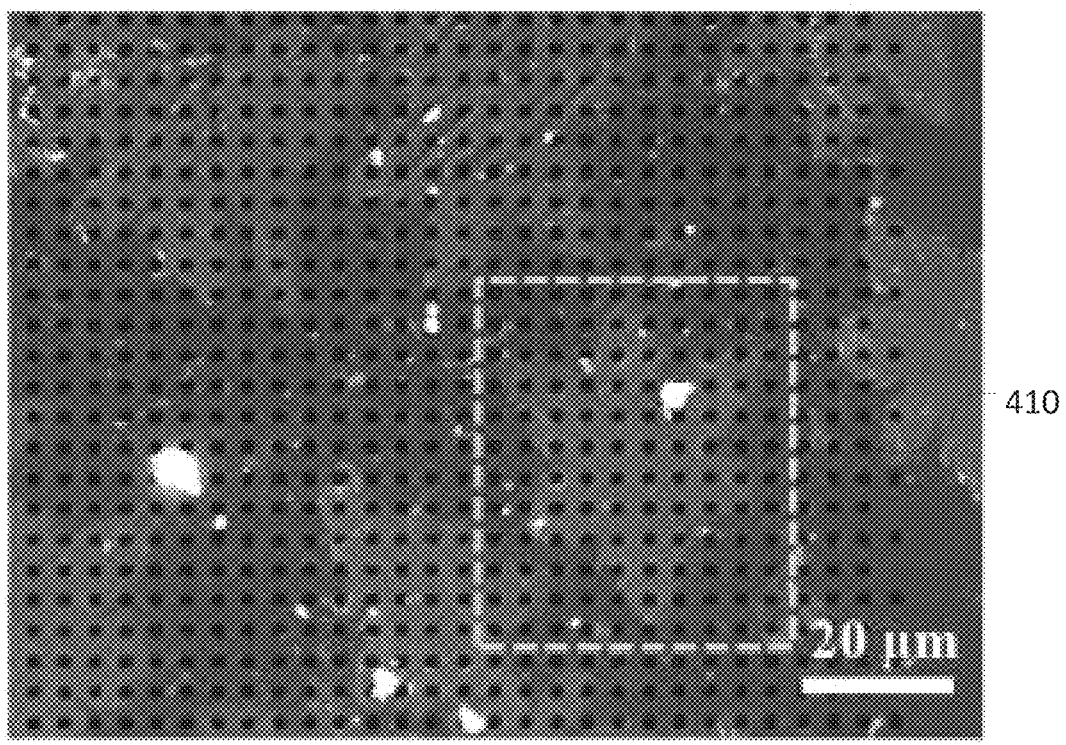
FIG. 4a show a SEM image of graphene flowers that have been transferred on a perforated silicon nitride (SiN) transmission electron microscope (TEM) grid.
Figure 4B:
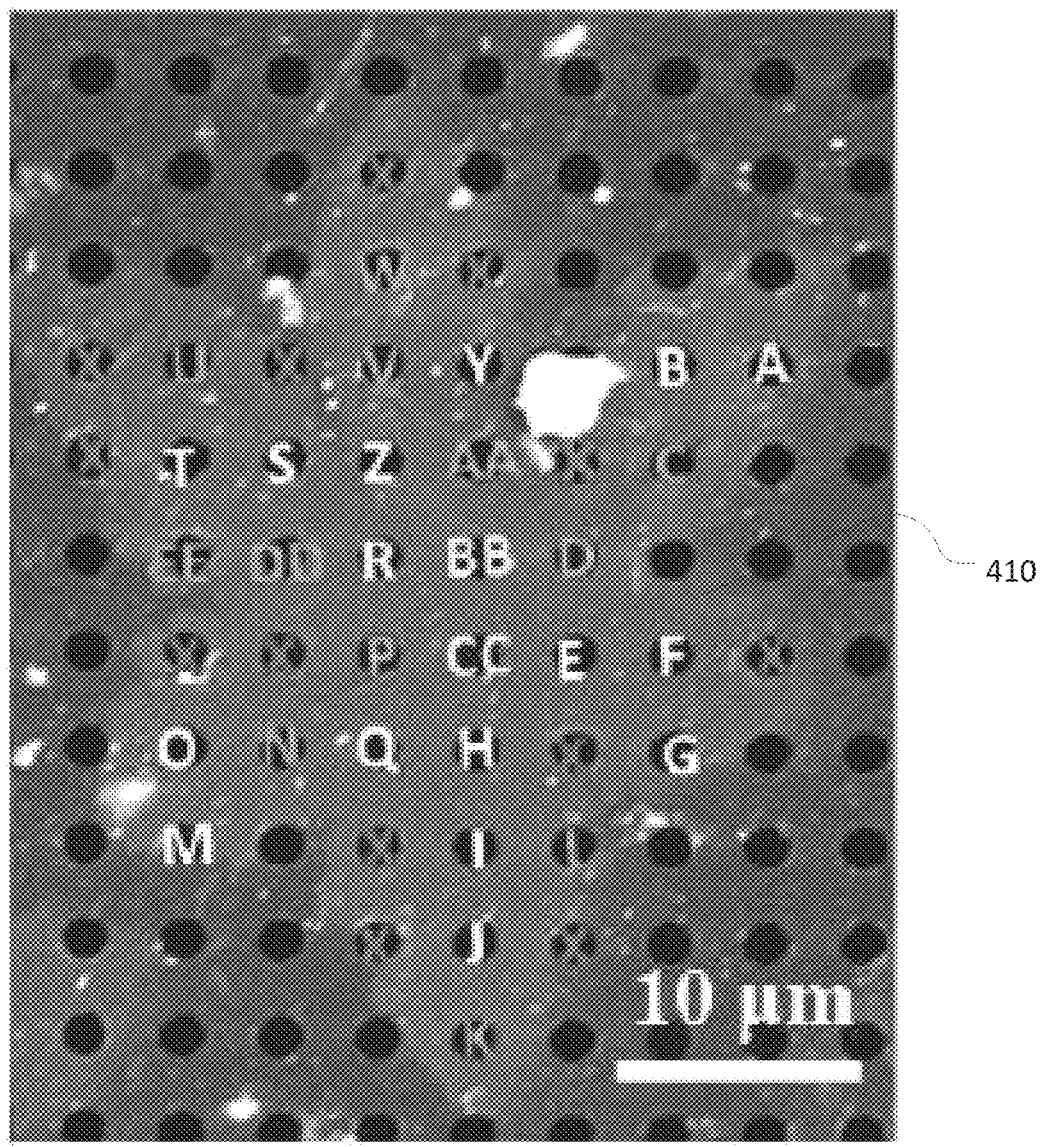

Here, selected area electron diffraction (SAED) was used as a reliable method to study the crystalline structure and grain size of graphene, which can be performed with readily available transmission electron microscopy (TEM). As-grown graphene flowers were transferred onto a perforated SiN TEM grid. SEM image of graphene on TEM grid in FIG. 4a shows that graphene retains its flower shape after transfer. FIG. 4b is a zoomed-in SEM image of the graphene flower 410 highlighted by dashed line in FIG. 4a.

Figure 4C:
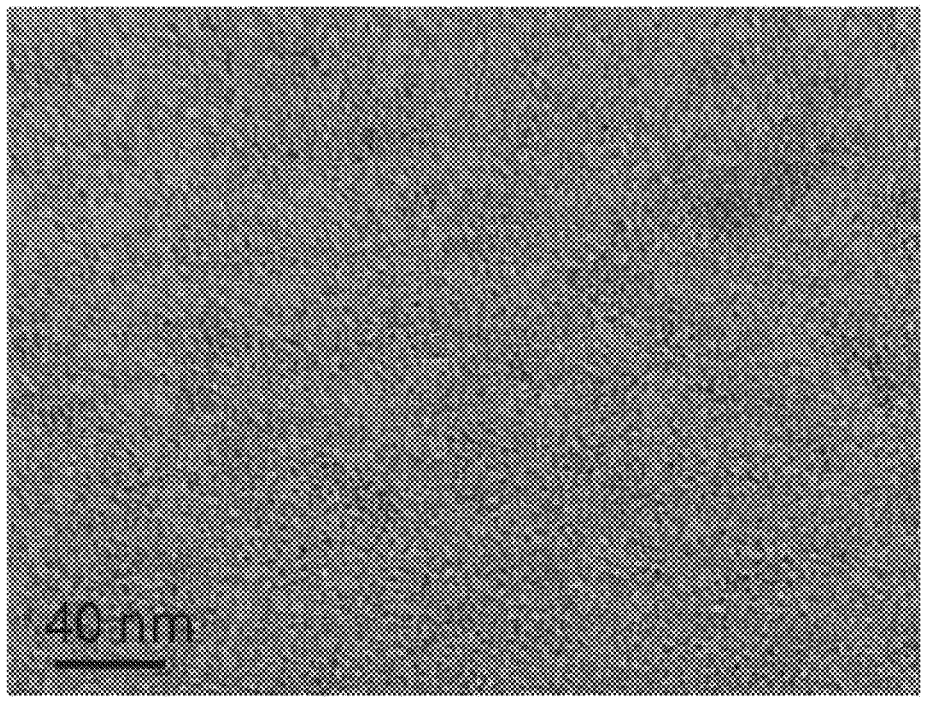
FIG. 4c shows a bright field TEM image of graphene suspended on SiN TEM grid.

In order to measure the grain size of graphene, SAED was performed on graphene at every opening of the SiN TEM grid within the graphene flower, and the orientation of the diffraction patterns was compared. As shown in FIG. 4b, one of three different kinds of diffraction patterns was marked for each opening within the graphene flower. The openings which were not covered by graphene membrane were marked by crosses. FIG. 4c shows a bright field TEM image of graphene membrane at a TEM grid opening covered by graphene membrane. The graphene membrane is clean, uniform, and smooth within the opening.

Figure 4D:
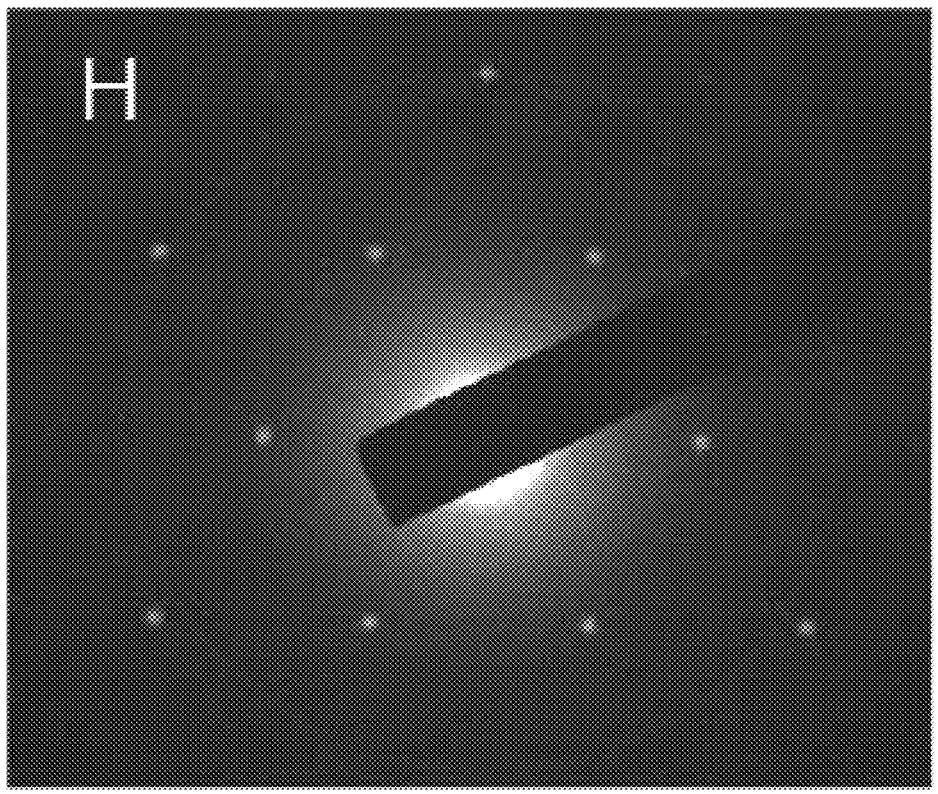
FIG. 4d shows a diffraction pattern taken from the opening H.
Figure 4E:
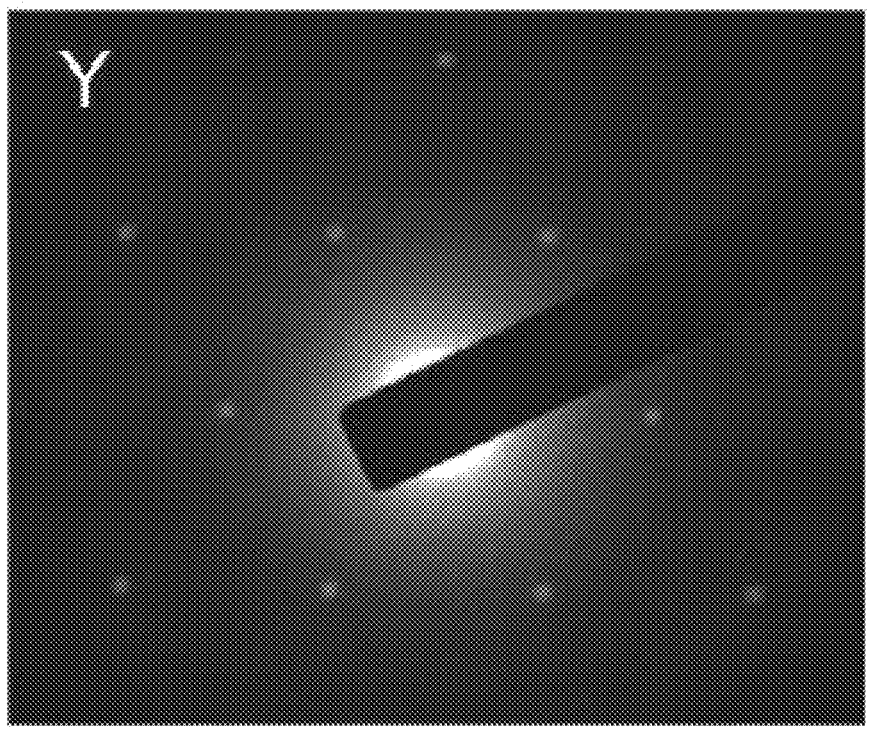
FIG. 4e shows a diffraction pattern taken from the opening Y.
Figure 4F:
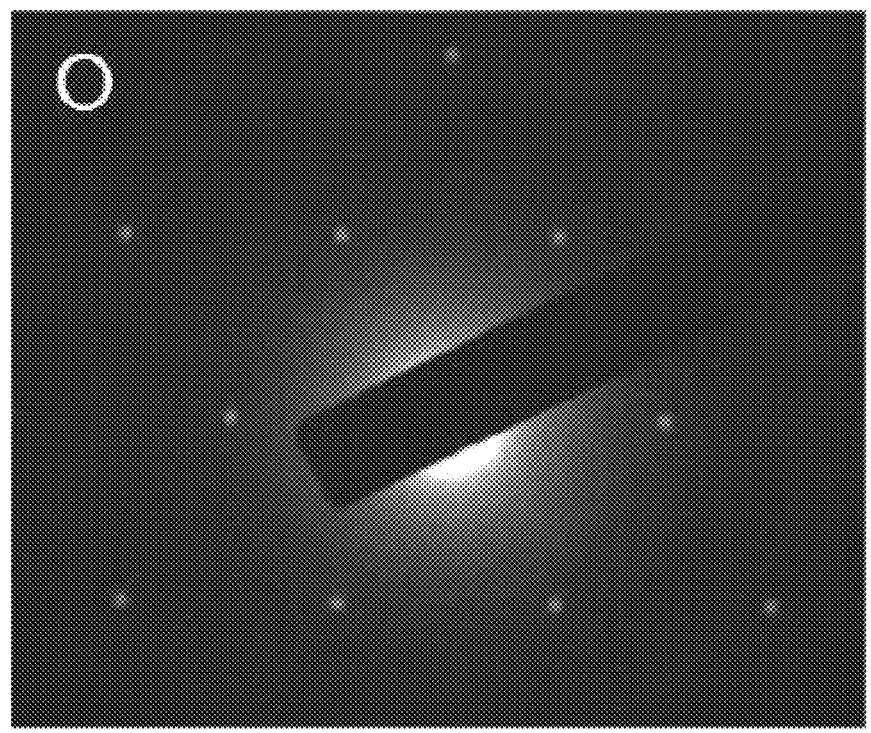
FIG. 4f shows a diffraction pattern taken from the opening O.

The openings marked A, B, Y, T, S, Z, E, F, O, Q, H, G, M, I, and J all show one set of symmetric six-fold electron diffraction pattern oriented in the same direction. FIGS. 4d, 4e, and 4f are images of three representative diffraction patterns from opening H, Y, and O, respectively. These openings cover all six lobes of the graphene flower, indicating that the graphene flower is a single-crystalline grain.

Figure 4G:
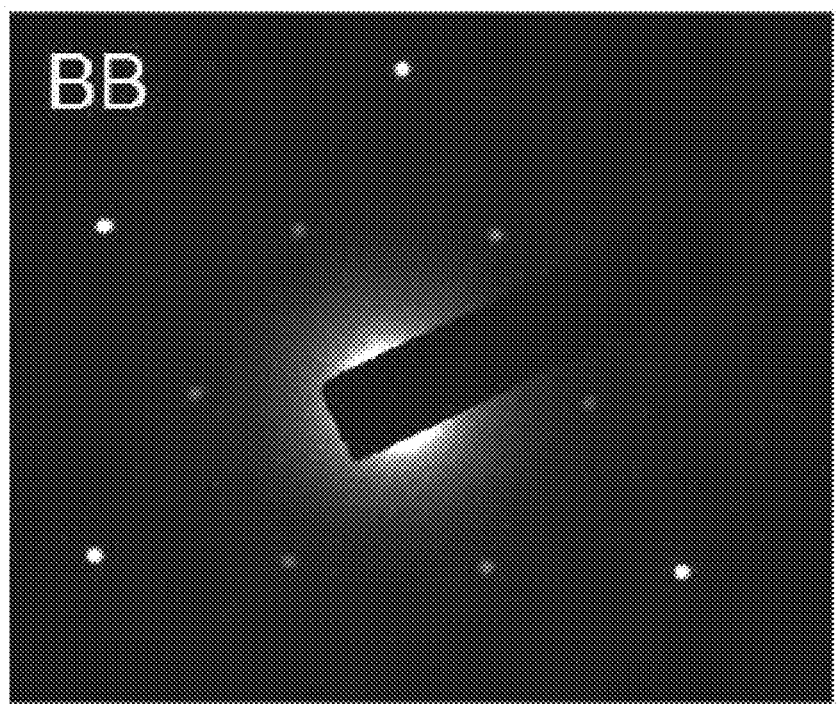
FIG. 4g shows a diffraction pattern taken from the opening BB.
Figure 4H:
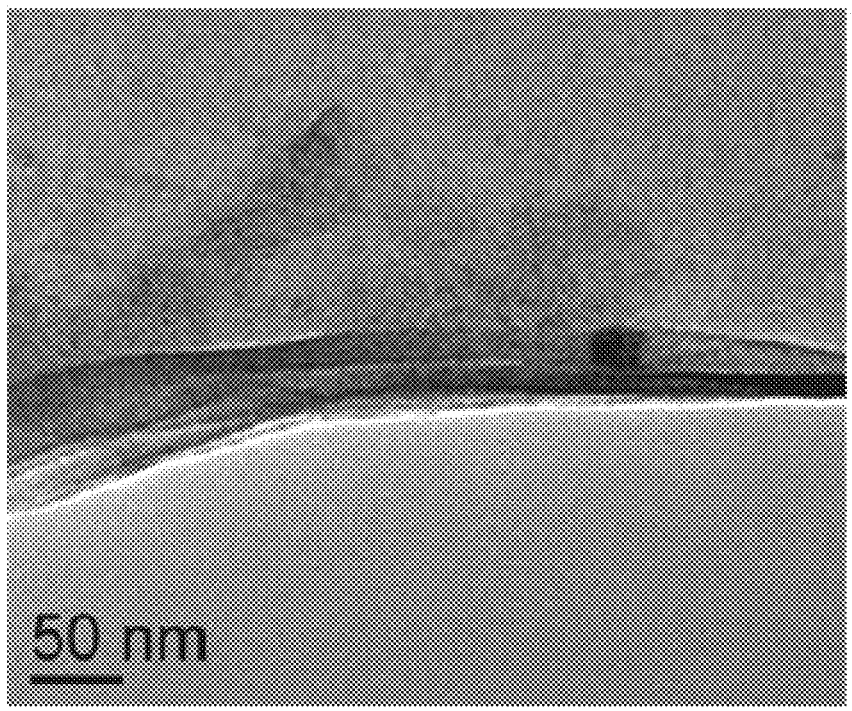
FIG. 4h shows a bright field TEM image of torn and folded graphene taken from the opening AA.
Figure 4I:
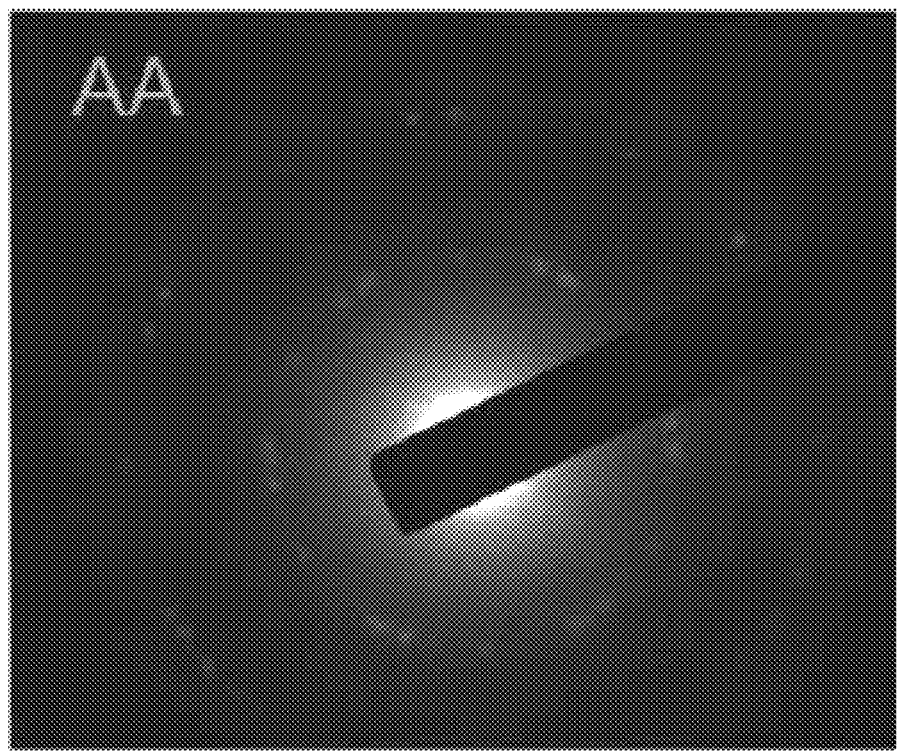
FIG. 4i shows a diffraction pattern taken from the opening AA.

FIG. 4g shows the diffraction pattern taken from the opening BB located at the center of the graphene flower, also displaying one set of symmetric six-fold diffraction spots. The outer set of diffraction spots are from equivalent planes {1-210}, showing higher (approximately twice) intensity than the inner set from {1-100}. This is believed to be a key feature for A-B stacking bilayer graphene. In A-B stacking, a corner of the hexagonal unit in the second (bottom) layer of graphene is directly below a center of a hexagonal unit of the first (top) layer of graphene. This observation is also in accordance with the Raman spectra (FIG. 3c) showing that the center of graphene flower is made up of bilayer graphene. The graphene membrane was torn or folded at some of the openings of the TEM grid. This might be due to the surface tension caused by the transfer process. FIG. 4h shows a bright field TEM image taken from opening AA, which is covered by torn and folded graphene film. The folded graphene membrane becomes multiple-layered, and hence the diffraction pattern taken from folded graphene membrane shows multiple sets of diffraction spots in FIG. 4i. The openings with torn and folded graphene membrane were marked W, U, V, AA, C, EE, DD, D, P, B, L, and K, and their diffraction patterns are all similar to the one shown in FIG. 4i. Excluding torn and folded graphene due to the transfer, it can be concluded that SAED on each opening covered by the graphene flower confirms that the graphene flower is a single-crystalline graphene grain, and the center of the graphene flower is A-B stacking bilayer graphene.

During synthesis process, it was observed that the morphology of large graphene grains changed when the parameters changed in the CVD system. Among various growth parameters, the total pressure of the CVD system and methane-to-hydrogen ratio were found to be two parameters that were closely related to the morphology of graphene grains. The total pressure was varied at a fixed methane to hydrogen ratio (1:12.5) to investigate the correlation between the grain morphology and the total pressure. The methane-to-hydrogen ratio was varied at a fixed total pressure (150 mTorr) to investigate the correlation between the grain morphology and methane-to-hydrogen ratio.

Figure 5:
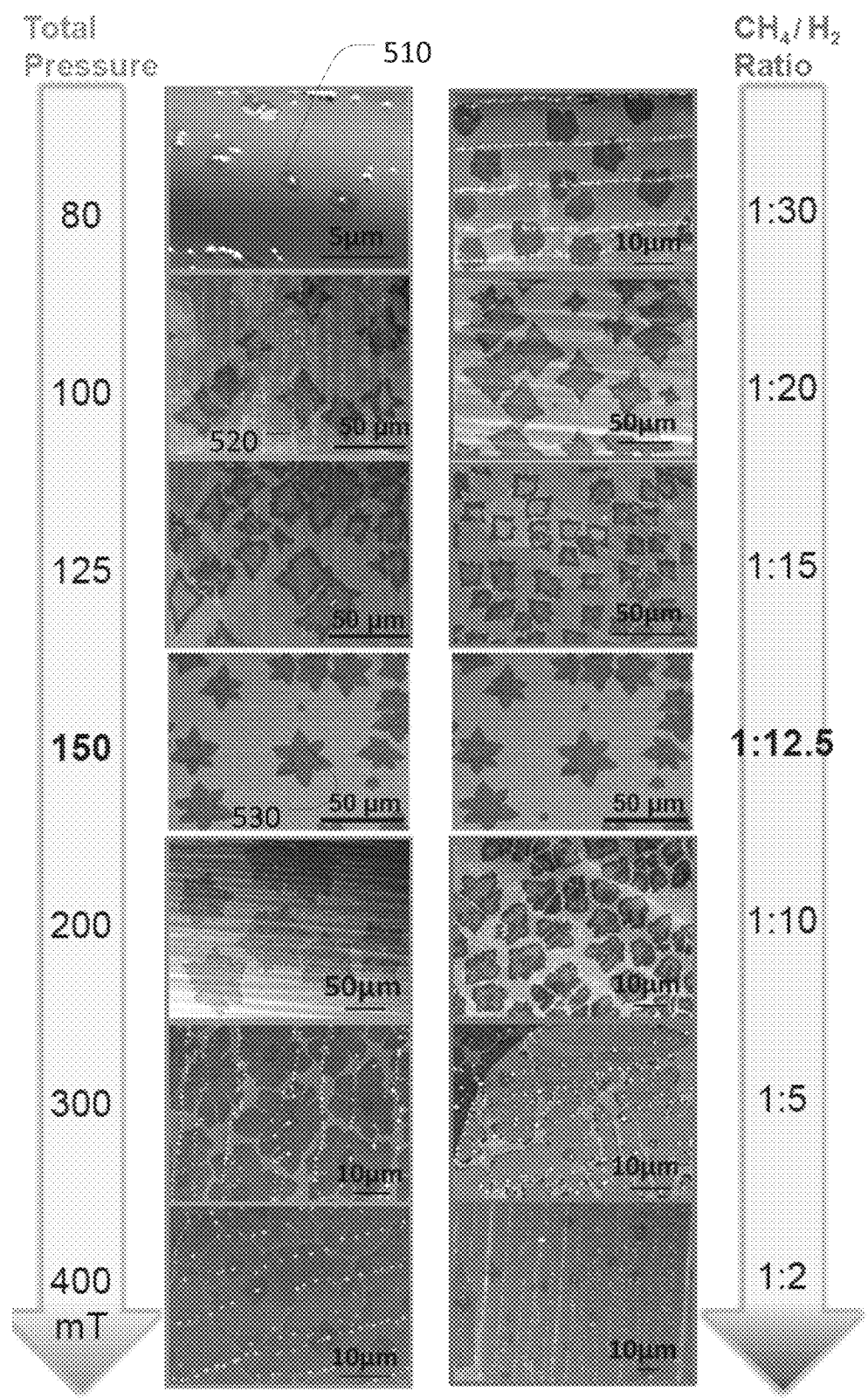
FIG. 5 shows SEM images of graphene grown using various recipes.

FIG. 5 shows the growth results using various conditions for a reaction time of 30 minutes. With methane-to-hydrogen ratio of 1:12.5, graphene CVD was carried out using the vapor-trapping method at total pressure of 80, 100, 125, 150, 200, 300, and 400 mTorr. Corresponding SEM images are shown in the left column in FIG. 5. It was observed that the graphene grains changed from irregular small flakes 510 (80 mTorr) to mostly four-lobe grains 520 (100 mTorr), and then changed to irregular patterns in between four-lobe and six-lobe flowers (125 mTorr), then to mostly six-lobe flowers 530 (150 and 200 mTorr). When the total pressure was further increased to 300 mTorr, the six-lobe graphene flowers turned to irregular shape when a reaction time of 30 minutes was used. The individual graphene grains tended to coalesce with each other when the total pressure was increased to 400 mTorr, leaving small gaps between irregular graphene grains. Interestingly, similar results were obtained even when the total pressure was kept at 150 mTorr while the methane to hydrogen ratio was gradually increased from 1:30 to 1:2.

As shown in the right column of SEM images in FIG. 5, graphene grains were small and close to hexagonal shape at 1:30 ratio, and then the graphene grains changed to mostly four-lobe structures when the methane-to-hydrogen ratio increased to 1:20. The grains exhibited shape between four-lobe and six-lobe flowers for $CH_4$:$H_2$ of 1:15, and exhibited mostly six-lobe flowers for $CH_4$:$H_2$ of 1:12.5. When the methane to hydrogen ratio was further increased to 1:10, the graphene grains became irregular. For $CH_4$:$H_2$ of 1:5, the graphene islands tended to connect with each other, leaving only small gaps in between. When methane-to-hydrogen ratio was brought up to 1:2, graphene grew into continuous film with multi-layer patches in some locations.

Increasing the total pressure of the CVD system has a similar effect on the morphology of graphene grains as increasing the methane-to-hydrogen ratio. The morphology of graphene grains changed from small irregular flakes to graphene flowers with lobe structures, and eventually coalesced into a quasi-continuous graphene film, with either an increase of total pressure or methane-to-hydrogen ratio.

The graphene growth is a balance between carbon diffusion/deposition and hydrogen etching. When the carbon supply is low (at low $CH_4$:$H_2$ ratio or low total pressure), the graphene nucleates and forms some initial structures, but the grains of graphene are small because of limited carbon supply and the etching effect of hydrogen. Low carbon supply means a ratio of $CH_4$:$H_2$ that is smaller than 1:30, or a pressure of hydrocarbon that is lower than 80 mTorr. When the carbon supply increases to a ratio between 1:20 to 1:12.5, or a pressure of between 100-150 mTorr, carbon diffuse along particular directions to grow into graphene lobes, and when the carbon supply increases further to a ratio of 1:10, or a pressure of 200 mTorr or more, the graphene grains grow close to each other and the original along-the-lobe carbon diffusion is perturbed. The morphology of graphene depends on both $CH_4$:$H_2$ ratio and the total pressure as the underlying mechanism includes both carbon diffusion/deposition and hydrogen etching. Carbon diffusion is the movement of carbon radical on the anisotropic copper surface. Carbon radicals can move along directions parallel to the copper crystalline directions.

Figure 6A:
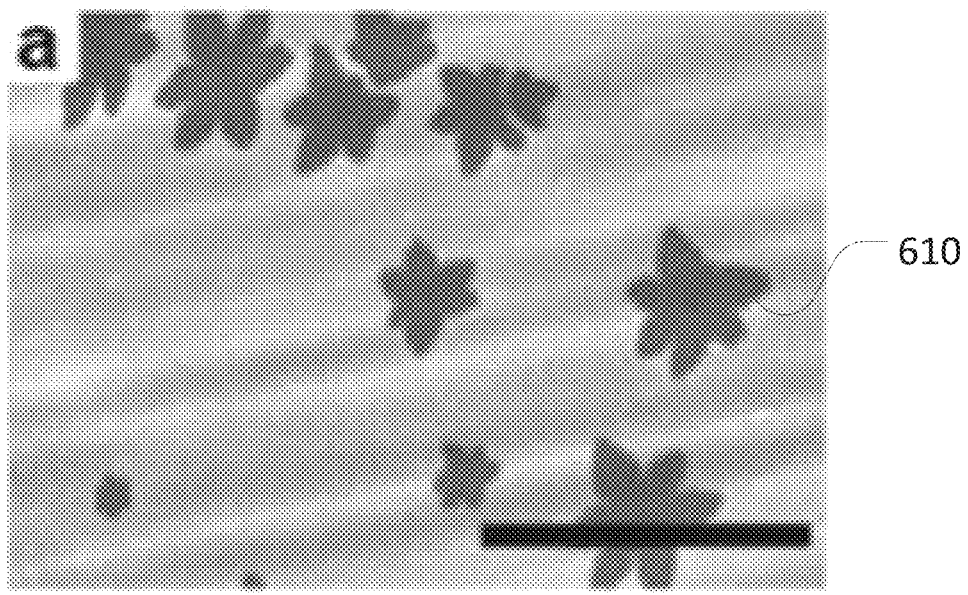
FIG. 6a shows a SEM image of graphene flowers produced using a growth time of 5 minutes at 300 mTorr.
Figure 6B:
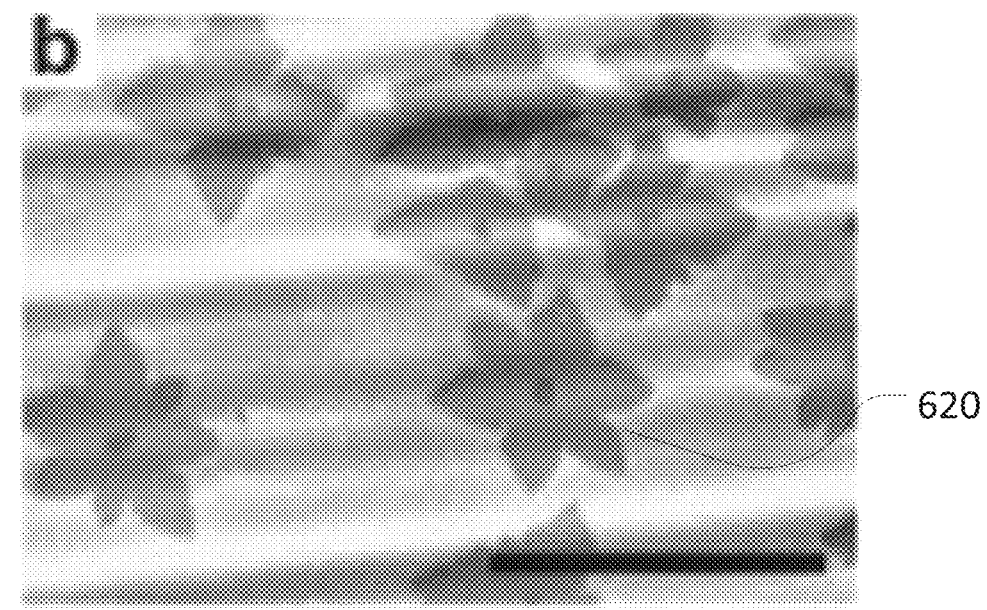
FIG. 6b shows a SEM image of graphene flowers produced using a growth time of 10 minutes at 300 mTorr.
Figure 6C:
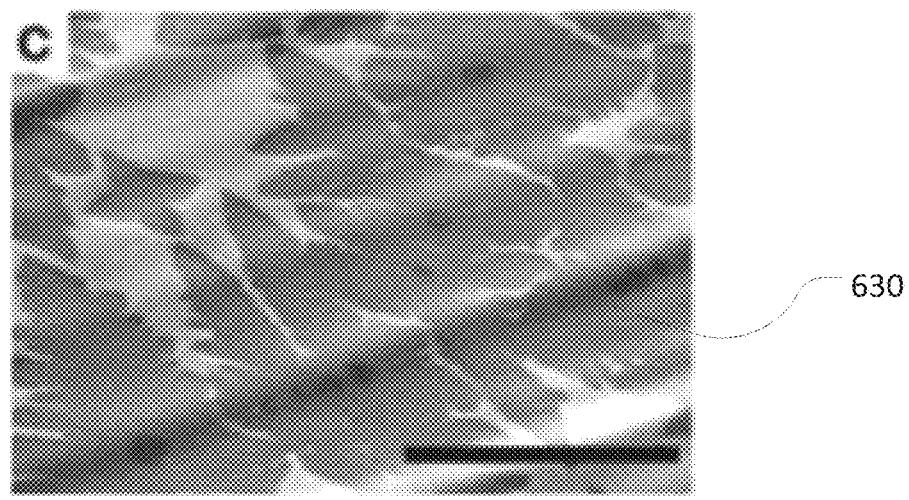
FIG. 6c shows a SEM image of graphene flowers produced using a growth time of 20 minutes at 300 mTorr.
Figure 6D:
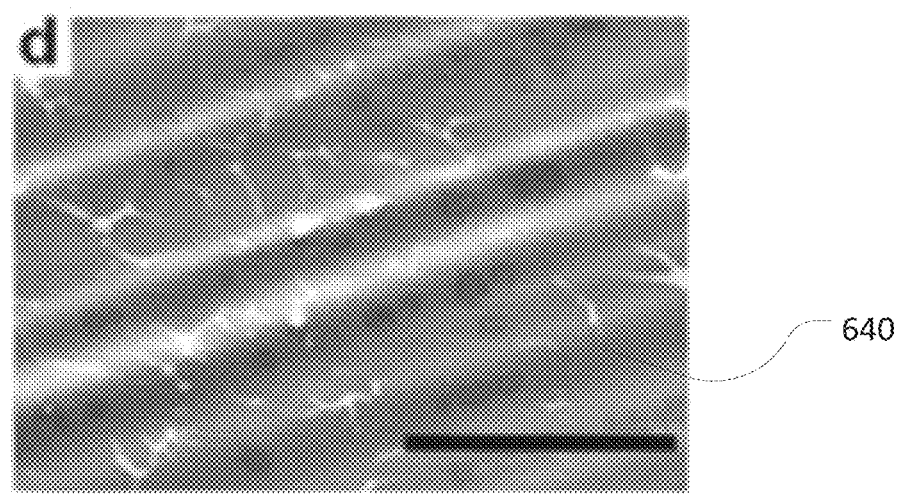
FIG. 6d shows a SEM image of graphene flowers produced using a growth time of 30 minutes at 300 mTorr.

FIGS. 6a-6d show results of graphene CVD at a pressure of 300 mTorr using different growth times. Lobed graphene flowers 610 were observed with growth time of 5 minutes in FIG. 6a. Larger lobed graphene flowers 620 were observed after a growth time of 10 minutes as shown in FIG. 6b. For a growth time of 20 minutes, as shown in FIG. 6c, adjacent graphene flowers 630 were observed to grow close to one another. At a growth time of 30 minutes, as shown in FIG. 6d, the graphene grains grew close to each other to form an almost continuous film 640, and the morphology became irregular due to disturbed diffusion path of carbon by adjacent flakes. The scale bar in these images is 50 μm.

Figure 7A:
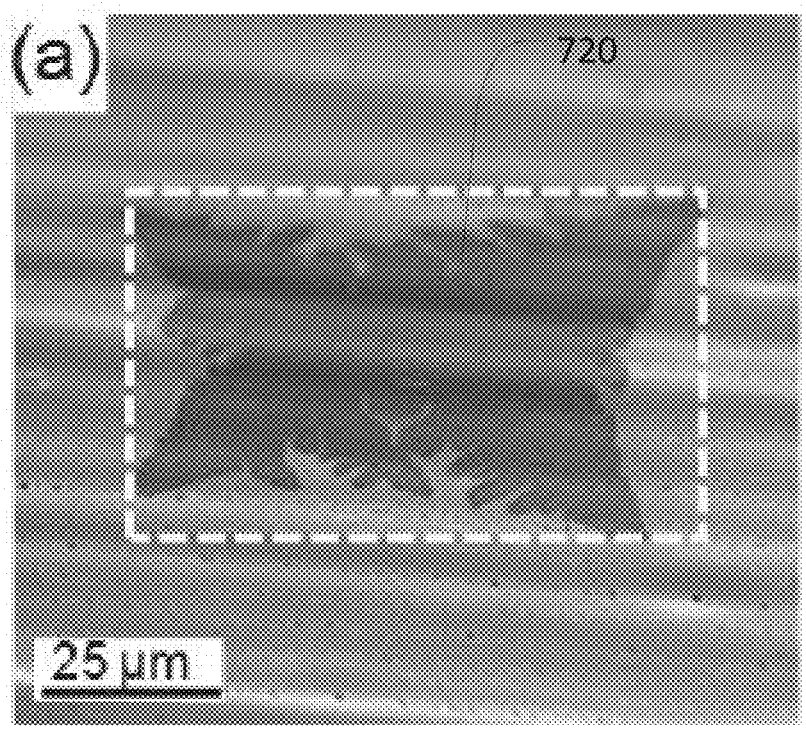
FIG. 7a shows a SEM image of a four-lobe graphene flower.
Figure 7B:
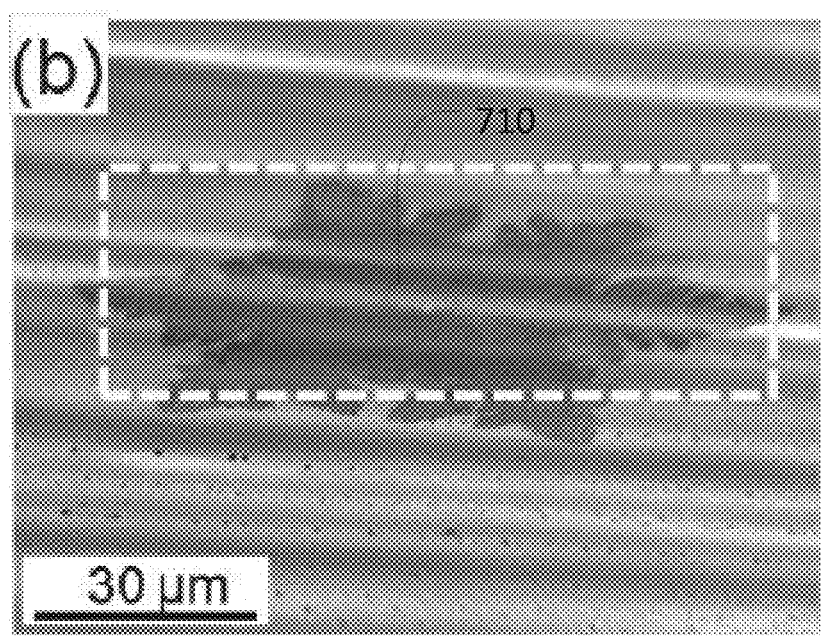
FIG. 7b shows a six-lobe graphene flower.
Figure 7C:
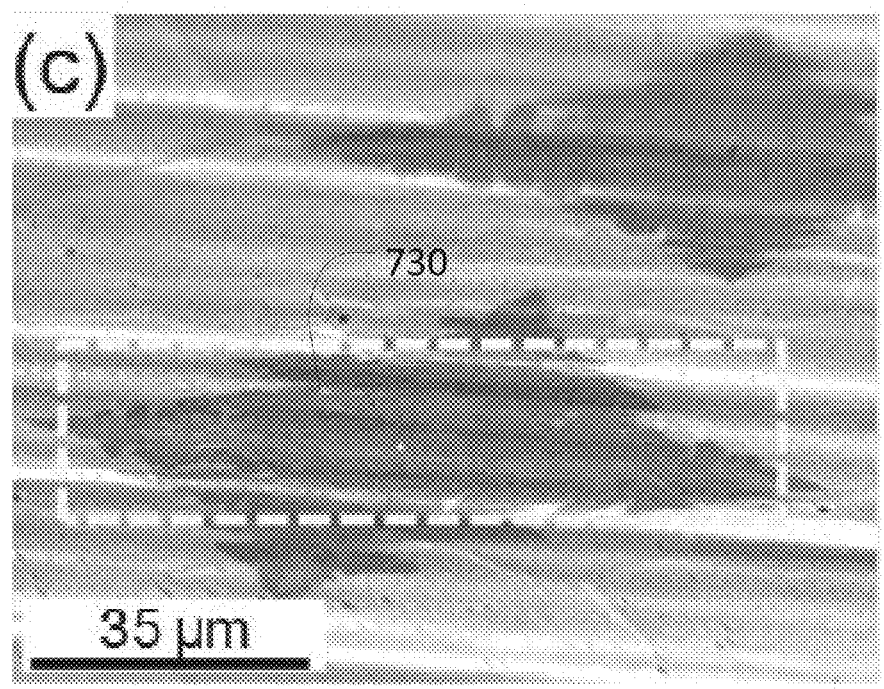
FIG. 7c shows another four-lobe graphene flower on the same graphene sample.
Figure 7D:
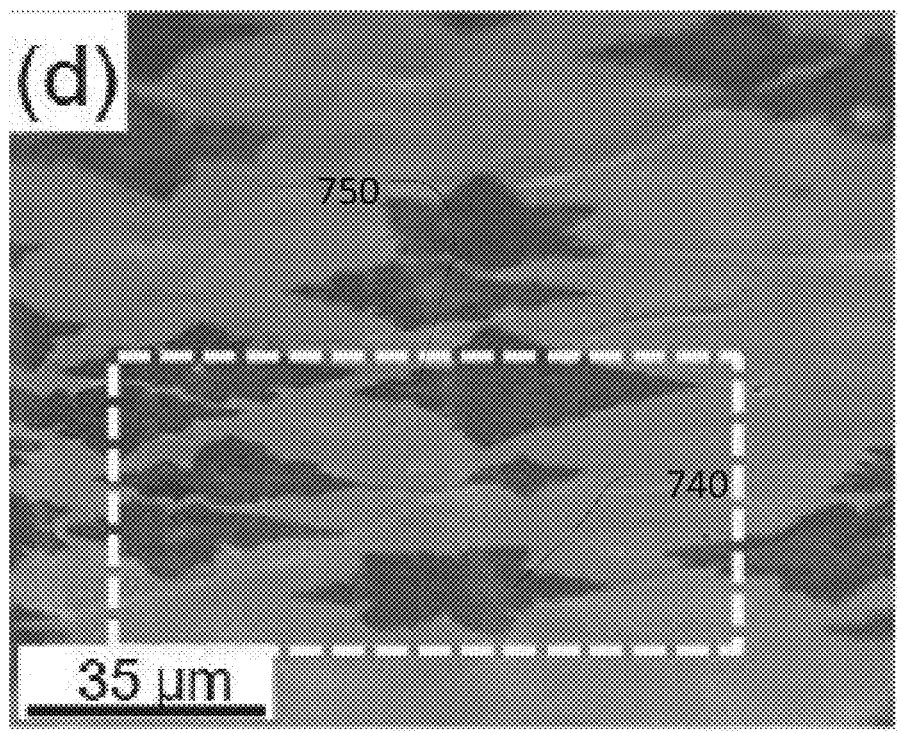
FIG. 7d shows a SEM image of a sample with six-lobe, and four-lobe graphene flowers, and copper grain boundaries.
Figure 7H:
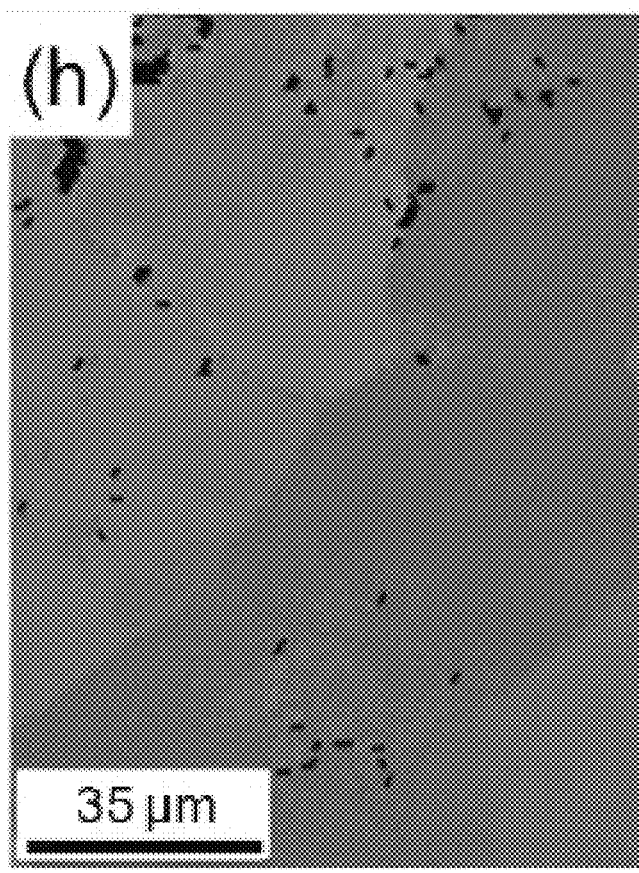
FIG. 7h shows a corresponding EBSD orientation map image of the location highlighted by the dashed square in FIG. 7d.
Figure 7I:
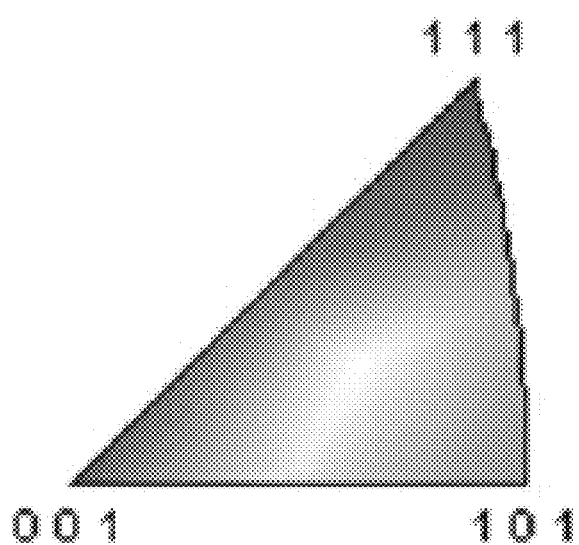
FIG. 7i shows a color representation of fcc crystalline orientation.

Electron backscatter diffraction (EBSD) was used to investigate the copper surface after graphene growth to further study the correlation between the morphology of graphene grains and the copper surface underneath. FIGS. 7a-7d show EBSD images of copper surface covered by graphene flowers having different shapes. FIGS. 7a, 7b, and 7c are SEM images of graphene flowers grown at different locations on the same copper substrate at a $CH_4$:$H_2$ ratio of 1:12.5 and a total pressure of 200 mTorr. The images are taken with the sample tilted at 70° for EBSD. The graphene grains 710 on this sample were mostly six-lobe flowers (e.g. FIG. 7b), with a few four-lobe flowers (720, 730) in some locations (e.g. FIGS. 7a and 7c). Corresponding EBSD orientation map images for the locations highlighted by dashed squares in FIGS. 7a, 7b, and 7c are shown in FIGS. 7e, 7f, and 7g, respectively. Copper has face-centered cubic (fcc) crystalline structure, such that plane (100) looks similar to planes (010) and (001). Likewise, the plane (011) looks similar to (101) and (110). EBSD orientation map image in FIGS. 7e and 7f show similar but slightly different green colors, which are close to Cu (110), as indicated in the color scale bar of fcc crystal orientation, as shown in FIG. 7i.

EBSD orientation map in FIG. 7g shows orange-magenta color, indicating a crystal orientation close to Cu (100). FIGS. 7a and 7b (and the corresponding FIGS. 7e and 7f) indicate that graphene grains can grow into different morphology (four-lobe and six-lobe, respectively) on the copper substrate having similar crystalline orientations (Cu (100)). FIG. 7a and FIG. 7c (and the corresponding FIG. 7e and FIG. 7g) show that the underlying copper crystalline orientation (Cu(110) and Cu(100), respectively) is not closely related to the morphology of the graphene grains (both of which are four-lobe) grown on top.

Additionally, a sample having copper grain boundaries and both four- and six-lobe graphene flowers grown on the surface was investigated. Each copper grain is a single-crystal, but different grains can have different orientations at the grain boundaries. FIG. 7d shows a SEM image of copper grain boundaries and both four- and six-lobe graphene flowers 740, 750 grown using different conditions, where the $CH_4$:$H_2$ ratio is 1:12.5 and the total pressure is 125 mTorr. The corresponding EBSD orientation map of the location demarcated by a dashed rectangle in FIG. 7h shows crystalline orientation close to Cu (100), with slight orientation differences between adjacent copper grains. The black points in the EBSD images correspond to locations where the instrument cannot determine the crystal orientation with high confidence.

The results from EBSD indicate that for the CVD growth on polycrystalline copper foil, the morphology of graphene grains do not have much correlation with the crystalline structure of the copper substrate underneath. In fact, both four-lobe and six-lobe graphene flower morphology have been observed on polycrystalline copper foil or single crystal copper. It has also been reported that the interaction between graphene and underlying copper substrate was weak, and since the copper atoms are almost freely mobile, they may act as carbon carriers to extend the graphene grains. At sufficiently high temperatures, such copper atoms exist as copper islands on the surface due to high enough surface energy. These copper islands serve as carbon carriers when carbon radicals are attached to them and both the copper islands and carbon radicals move around on the surface of the copper metal. Therefore, it is believed that the morphology of graphene grains is mostly related to the local environment close to the copper substrate, and can be tuned by varying growth parameters (e.g., pressure, methane-to-hydrogen ratio, flow rate, etc.), but the graphene morphology does not have much correlation with the underlying copper substrate.

Figure 8A:
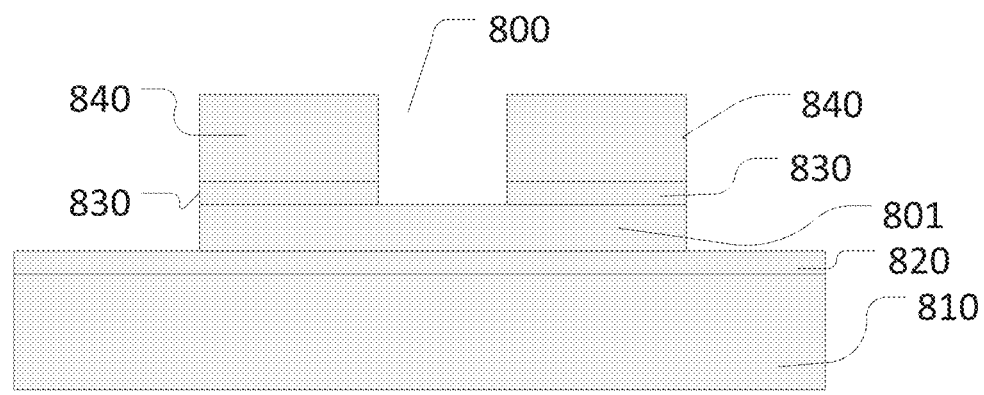
FIG. 8a shows a schematic diagram of a graphene field-effect transistor (FET).

To evaluate the quality of the large-grain single-crystalline graphene flowers, a back-gated graphene FET 800 was fabricated as shown schematically in FIG. 8a. As-grown graphene grains 801 were transferred onto a highly doped p-type silicon substrate 810. A layer 820 of thermal oxide is the gate dielectric. In some embodiments, the layer 820 contains 300 nm of thermal oxide, for example, $SiO_2$. A metal layer 830 and a metal layer 840 were deposited using electron beam evaporation to form the source and drain electrodes. The metal layer 830 may be a 5 nm layer of Ti while the metal layer 840 maybe a 50 nm layer of Pd. The metal layer 830 serves as an adhesion layer.

Figure 8D:
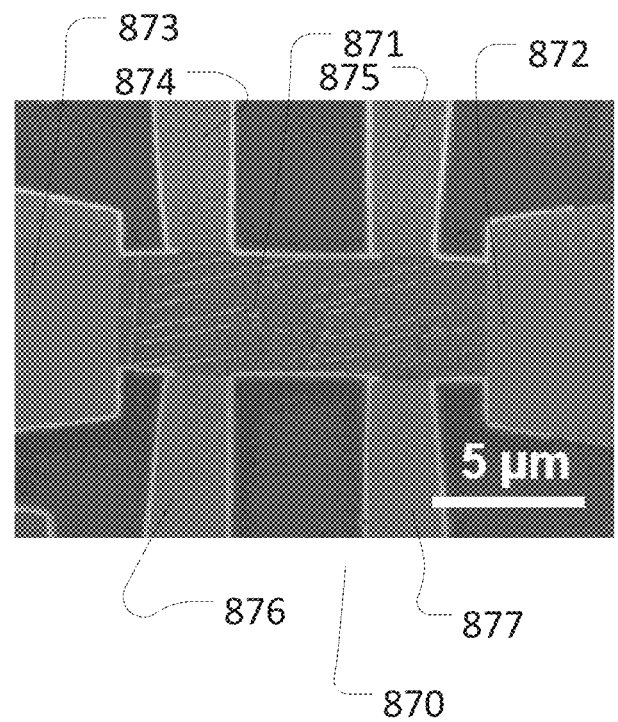
FIG. 8d shows a SEM image of a hall-bar graphene/h-BN FET.
Figure 8B:
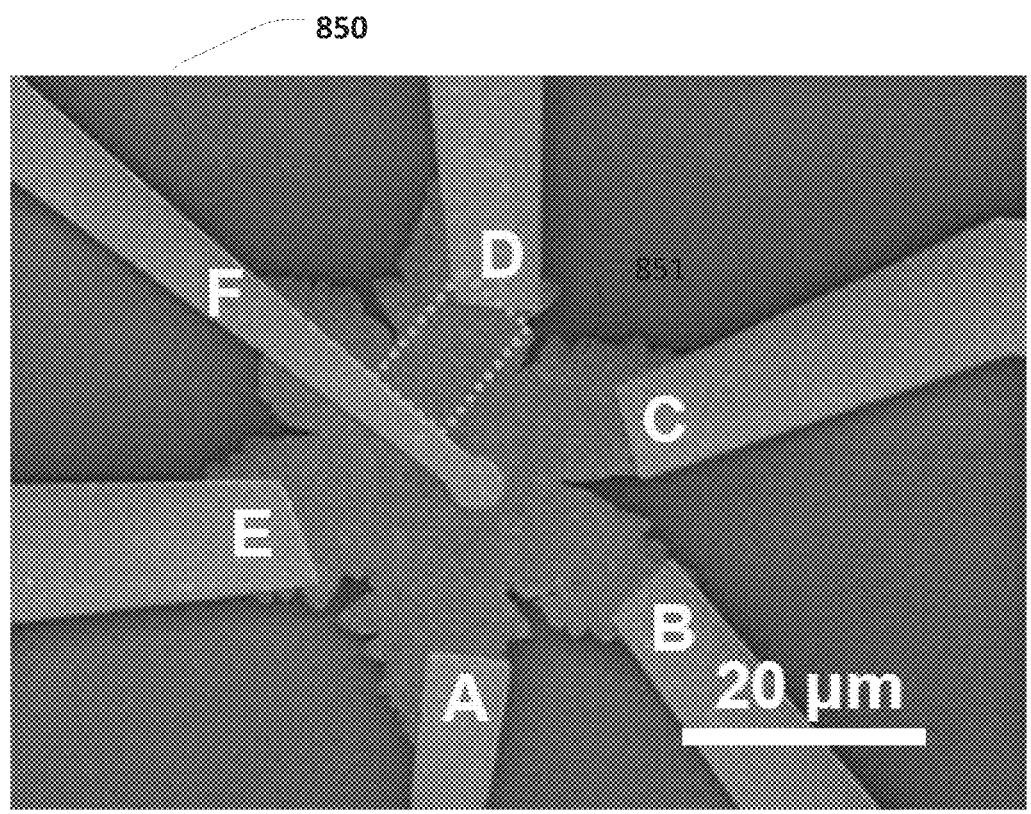
FIG. 8b shows a SEM image of a six-lobe graphene FET.

FIG. 8b shows a SEM image of a graphene FET 850. Five electrodes marked from A to E are each formed at one lobe of the six-lobed graphene flower 851 while an electrode marked F is fabricated in the central portion of the graphene flower 851, formed of a graphene bilayer. The electrode F terminates in a region of monolayer graphene on the periphery of the bilayer graphene. In this way, only the electrical properties due to monolayer graphene is measured because a shortest distance traversed by an electron between electrode F and each of electrodes A, B, C, D, and E is composed of monolayer graphene.

Figure 8C:
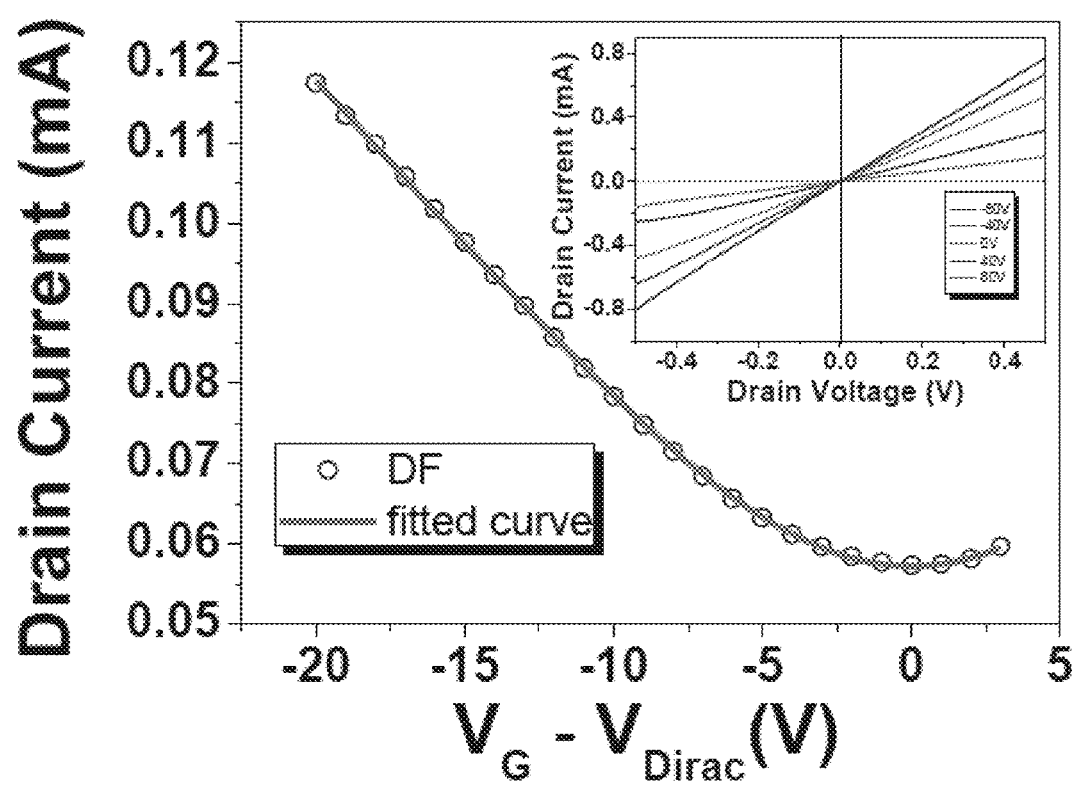
FIG. 8c shows a plot of drain current ($I_{ds}$) versus gate voltage ($V_g$) minus Dirac point voltage ($V_{Dirac}$) and a fitted FET mobility curve (solid line). Inset is a plot of drain current ($I_{ds}$) versus drain voltage ($V_{ds}$) at various gate voltages.

FIG. 8c shows a representative plot (shown in circles) of drain current ($I_{ds}$) versus gate voltage ($V_g$) minus Dirac point voltage ($V_{Dirac}$) using D and F as source and drain electrodes, respectively. $V_{Dirac}$ is the gate voltage at minimum drain current. The drain voltage ($V_{ds}$) is 0.2 V. The curve was fitted to retrieve the field effect mobility $\mu_{FE}$ using the equation $$R_{total} = \frac{1}{e\mu_{FE}\sqrt{n_0^2+n^2}}\frac{L}{W} + R_c \quad (1)$$

where $R_{total} = V_{ds}/I_{ds}$ is the total resistance of the device, which is the sum of the graphene channel resistance (first term on the right hand side of equation (1)), which is the resistance due to the presence of graphene over a particular area and contact resistance $R_c$, which is the resistance between metal and graphene. e is the electron charge, L and W are the length and width of the graphene channel, respectively, and $n_0$ and n are the carrier density due to residual impurities and back-gate modulation, respectively. Back gate modulation is the change in the carrier density due to the application of a gate voltage. The capacitive carrier density n is related to the gate voltage via the equation $$V_{BG} - V_{Dirac} = \frac{ne}{C_{ox}} \quad (2)$$

where $C_{ox}$ is the back-gate electrostatic capacitance $C_{ox}$. $V_{BG}$ is the same as $V_G$ labeled in FIG. 7c. The quantum capacitance in graphene was not included on the right-hand side of equation 2 since it was negligible compared to the back-gate induced carrier density in back-gated devices. In back-gated devices, voltage is applied underneath the dielectric and graphene layers. In a top-gated device, the gate electrode is above both the graphene and the dielectric layer. While both top-gated and back-gated devices can be fabricated using the graphene produced by methods and apparatus disclosed herein, back-gated devices are demonstrated here due to their ease of fabrication. The drain current as a function of $V_G-V_{Dirac}$ for the back-gated device 850 was fitted as shown by the curve of FIG. 8c, from which fitted field effect mobility is obtained. As the graphene channel is not well-defined in the device 850, the channel dimension is estimated by the dimensions of the rectangle marked in FIG. 8b). The estimated L and W were 12 μm and 7.5 μm, respectively. The fitted field effect mobility (hole mobility) using these parameters was ~4,200 $cm^2V^{-1}s^{-1}$. The large number of data points in the negative $V_G-V_{Dirac}$ range as shown in FIG. 8c, provide better reliability in deriving the hole mobility. This value is comparable with the known mobility of large single crystal graphene, indicating the high quality of the synthesized graphene flowers.

The inset of FIG. 8c is a plot of drain current ($I_{ds}$) versus drain voltage ($V_{ds}$) at various gate voltages. The drain current increases linearly with the increase of drain voltage at different gate voltages, indicating the Ohmic contact between graphene and the Ti/Pd electrodes.

Much higher mobility can be expected for graphene flowers that are transferred onto crystalline boron nitride, such as hexagonal boron nitride (h-BN), as reported for CVD graphene. Large-grain graphene flowers were thus transferred onto exfoliated h-BN to fabricate a Hall-bar device 870 as shown in FIG. 8d. A rectangular graphene layer 871 is contacted by six metal electrodes 872, 873, 874, 875, 876 and 877. Photolithography and subsequent oxygen plasma etching is used to remove graphene outside the region defined by the rectangular graphene layer 871 from the Hall-bar device 870. Electrical current flows from electrode 873 to electrode 872 (or from the electrode 872 to the electrode 873) and the voltage drop can be measured between electrode 876 and electrode 877 or between electrode 874 and electrode 875. In other words, electrodes 874-877 serve as voltage probes. Typically, there is no voltage drop across electrodes 874 and 876, or across electrodes 875 and 877. When a magnetic field is applied in a plane normal to the device (i.e. into or out of the plane of the drawing), a current can flow between electrodes 874 and 876, and electrodes 875 and 877. The Hall-bar device 870 eliminates contact resistance between electrodes 874-877 and the graphene layer 871.

Figure 8E:
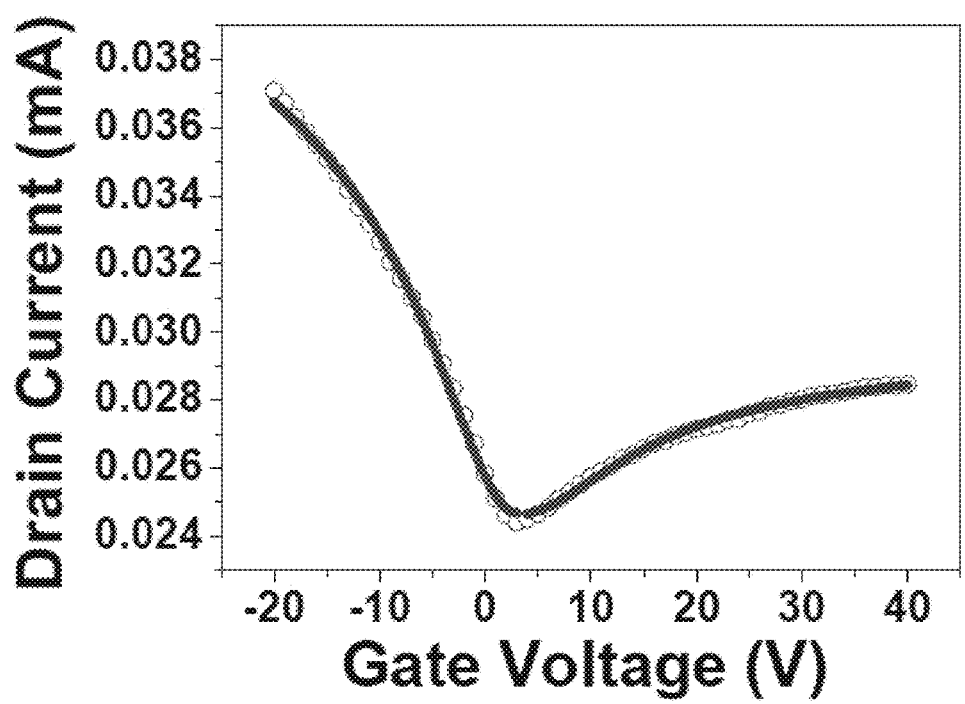
FIG. 8e shows a plot of drain current ($I_{ds}$) versus gate voltage ($V_g$).

FIG. 8e shows a plot (shown in circles) of drain current ($I_{ds}$) versus gate voltage ($V_g$) of the Hall-bar device 870, with a channel length of 13.5 μm and width of 4.5 μm. The experimental data was fitted with the same equation used in the back-gated device on Si/SiO$_2$ and is shown as the curve in FIG. 8e. The extracted hole and electron mobility is ~10,000 cm$^2$V$^{-1}$s$^{-1}$ and ~20,000 cm$^2$V$^{-1}$s$^{-1}$, respectively. The large-grain graphene flowers fabricated using the vapor-trapping methods described herein have high mobility, which is advantageous for graphene-based nanoelectronics.

Thus, a vapor-trapping method to grow large-grain, single-crystalline graphene with controlled grain morphology and grain size up to 100 μm is described. Raman spectra indicate that the graphene flowers have high quality single-layer graphene as lobes and bilayer graphene as centers. SAED confirms the single-crystalline nature of graphene flowers. Systematic study of the graphene morphology versus growth parameters, such as total pressure of the CVD system, and the methane-to-hydrogen ratio, and EBSD study indicate that the graphene morphology mostly relates to the local environment around the growth area, and does not have much correlation with the crystalline orientation of the underlying copper substrate. FETs have been fabricated based on the large-grain graphene flowers, and high device mobility ~4,200 cm$^2$V$^{-1}$s$^{-1}$ on Si/SiO$_2$ and ~20,000 cm$^2$V$^{-1}$s$^{-1}$ on h-BN have been achieved. The electrical properties of single-layer graphene from four-lobed graphene flowers and from six-lobed graphene flowers are expected to be similar.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. A method comprising:
    placing a vessel comprising a quartz tube having an open end into a chemical vapor deposition chamber, wherein metal foil is positioned into the vessel, and wherein the open end of the vessel is directly facing and closer to a first opening of the chemical vapor deposition chamber than a closed end of the vessel is to the first opening;
    evacuating the chemical vapor deposition chamber;
    flowing hydrogen gas through the chamber from the first opening of the chamber to a second opening of the chamber to achieve a first pressure less than atmospheric pressure;
    heating the atmosphere in the chamber to anneal the metal foil;
    flowing methane and hydrogen through the chamber from the first opening of the chamber to the second opening of the chamber to achieve a second pressure less than atmospheric pressure; and
    depositing carbon on the metal foil to yield a single-crystalline graphene layer on the metal foil.

2. The method of claim 1, wherein the methane and hydrogen introduced into the chamber do not flow through the vessel.

3. The method of claim 2, wherein the methane and hydrogen introduced into the chamber diffuse into the vessel.

4. The method of claim 1, wherein a local environment between the metal foil and an interior of the vessel is different from an environment inside the chamber, and wherein the metal foil is a copper foil.

5. The method of claim 4, wherein the vessel reduces a supply of carbon to the metal foil and creates a quasi-static reactant gas distribution.

6. The method of claim 1, wherein the graphene layer is in a shape of a four-lobed flower, a six-lobed flower, or a combination thereof.

7. The method of claim 1, wherein a dimension of the graphene layer on the metal foil is less than or about 100 μm.

8. The method of claim 6, wherein lobes of the four-lobed flower, the six-lobed flower, or the combination thereof are a single-layer graphene.

9. The method of claim 6, wherein a center of the four-lobed flower, the six-lobed flower, or the combination thereof is a bilayer graphene.

10. The method of claim 1, further comprising adjusting a total pressure, a methane to hydrogen flow rate ratio, or both to obtain a desired morphology.

11. The method of claim 1, wherein a ratio of a flow rate of the methane to a flow rate of the hydrogen is between 1:10 to 1:20.

12. The method of claim 1, wherein a total pressure of the methane and hydrogen is less than 200 mTorr.

13. The method of claim 1, further comprising removing the graphene layer from the metal foil.

14. The method of claim 1, wherein the graphene layer produces one set of symmetric six-fold electron diffraction patterns oriented in a same direction.

15. A method of forming a field effect transistor, the method comprising:
    providing a silicon substrate;
    providing a thermal oxide layer on the silicon substrate;
    transferring the graphene layer formed by the method of claim 1 from the metal foil onto the thermal oxide layer to form a graphene channel;
    depositing a source electrode at one end of the graphene channel; and
    depositing a drain electrode at another end of the graphene channel.

* * * * *

UNITED STATES PATENT AND TRADEMARK OFFICE
CERTIFICATE OF CORRECTION

PATENT NO. : 9,627,485 B2  
APPLICATION NO. : 14/214173  
DATED : April 18, 2017  
INVENTOR(S) : Chongwu Zhou et al.

Page 1 of 1

It is certified that error appears in the above-identified patent and that said Letters Patent is hereby corrected as shown below:

In the Specification

Column 1, Line 15:
After "FEDERALLY SPONSORED RESEARCH OR DEVELOPMENT", Delete:
"The invention was made with government support under N000141210806 A00002 and N000141110880 P00005 awarded by the Office of Naval Research. The government has certain rights in the invention."
And Insert:
--This invention was made with government support under N00014-1 1-1-0880 awarded by the Office of Naval Research. The government has certain rights in the invention.--

Signed and Sealed this
Thirteenth Day of May, 2025

Coke Morgan Stewart
*Acting Director of the United States Patent and Trademark Office*